US011940552B2

(12) United States Patent
Leibetseder et al.

(10) Patent No.: US 11,940,552 B2
(45) Date of Patent: Mar. 26, 2024

(54) ELECTRICAL CIRCUIT, PULSE RADAR DEVICE, METHOD FOR PROVIDING AN OUTPUT SIGNAL, AND RADAR METHOD

(71) Applicant: Infineon Technologies AG, Neubiberg (DE)

(72) Inventors: Alexander Leibetseder, Hargelsberg (AT); Andreas Stelzer, Linz (AT); Christoph Wagner, Enns (AT)

(73) Assignee: Infineon Technologies AG, Neubiberg (DE)

( * ) Notice: Subject to any disclaimer, the term of this patent is extended or adjusted under 35 U.S.C. 154(b) by 530 days.

(21) Appl. No.: 17/301,025

(22) Filed: Mar. 22, 2021

(65) Prior Publication Data

US 2021/0302532 A1 Sep. 30, 2021

(30) Foreign Application Priority Data

Mar. 25, 2020 (DE) .......................... 102020203841.4

(51) Int. Cl.
| | | |
|---|---|---|
| *G01S 7/282* | (2006.01) | |
| *G01S 7/285* | (2006.01) | |
| *G01S 13/10* | (2006.01) | |
| *H03D 7/12* | (2006.01) | |

(52) U.S. Cl.
CPC .............. *G01S 7/282* (2013.01); *G01S 7/285* (2013.01); *H03D 7/125* (2013.01); *G01S 13/10* (2013.01)

(58) Field of Classification Search
CPC .......... G01S 7/282; G01S 7/285; G01S 13/10; H03D 7/125
See application file for complete search history.

(56) References Cited

U.S. PATENT DOCUMENTS

| | | | | |
|---|---|---|---|---|
| 6,144,236 A  * | 11/2000 | Vice ..................... | H03D 7/1466 |
| | | | 327/119 |
| 6,351,632 B1 * | 2/2002 | Yan ......................... | H04B 1/28 |
| | | | 455/333 |
| 6,560,451 B1 * | 5/2003 | Somayajula ......... | H03D 7/1441 |
| | | | 455/333 |
| 7,299,025 B1 * | 11/2007 | Wong ...................... | H03D 7/14 |
| | | | 455/227 |
| 7,844,241 B2 * | 11/2010 | Kintis ...................... | H04B 1/28 |
| | | | 455/313 |
| 10,084,438 B2 * | 9/2018 | Lu .......................... | H03B 19/14 |
| 2009/0323864 A1 * | 12/2009 | Tired ..................... | H03D 7/145 |
| | | | 375/319 |
| 2012/0142298 A1 * | 6/2012 | Winoto ................ | H03G 3/3068 |
| | | | 455/234.1 |

(Continued)

FOREIGN PATENT DOCUMENTS

DE 102013114735 A1 6/2015

*Primary Examiner* — Peter M Bythrow
(74) *Attorney, Agent, or Firm* — Harrity & Harrity, LLP

(57) ABSTRACT

An electrical circuit for providing an output signal based on a first input signal and a second input signal has: a mixer which is configured to receive and mix the first and second input signals in order to generate a mixer output signal and to switch on or off based on the first input signal, wherein a DC signal component of the mixer output signal depends on whether the mixer is switched on or off; and a downstream circuit which is configured to switch on or off based on the DC signal component of the mixer output signal and to provide the output signal based on the mixer output signal.

21 Claims, 29 Drawing Sheets

(56) References Cited

U.S. PATENT DOCUMENTS

2016/0308521 A1* 10/2016 Ro ......................... H03D 7/125
2016/0327422 A1* 11/2016 Gluth .................... G01S 13/103
2019/0207558 A1* 7/2019 Mittal .................... H03D 7/165
2020/0225316 A1* 7/2020 Larsen ................... G01S 7/282
2021/0135356 A1* 5/2021 Hickle ................. H03D 7/1466

* cited by examiner

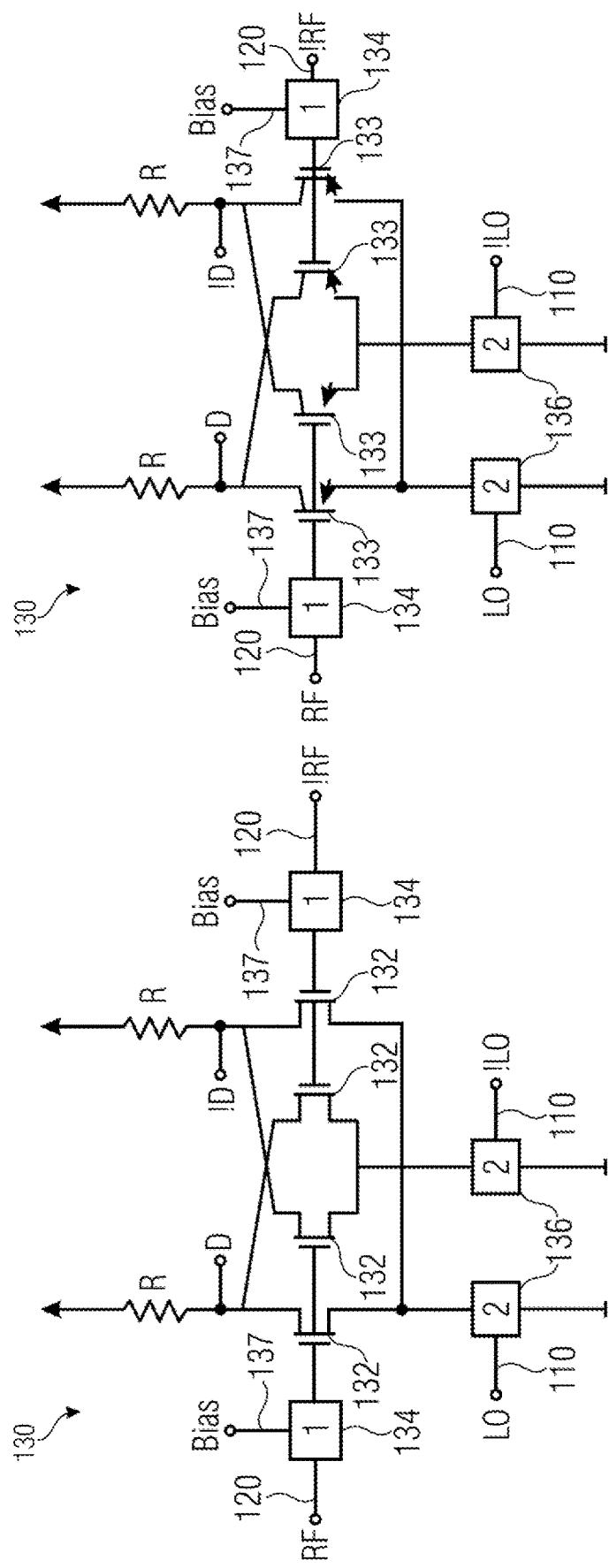

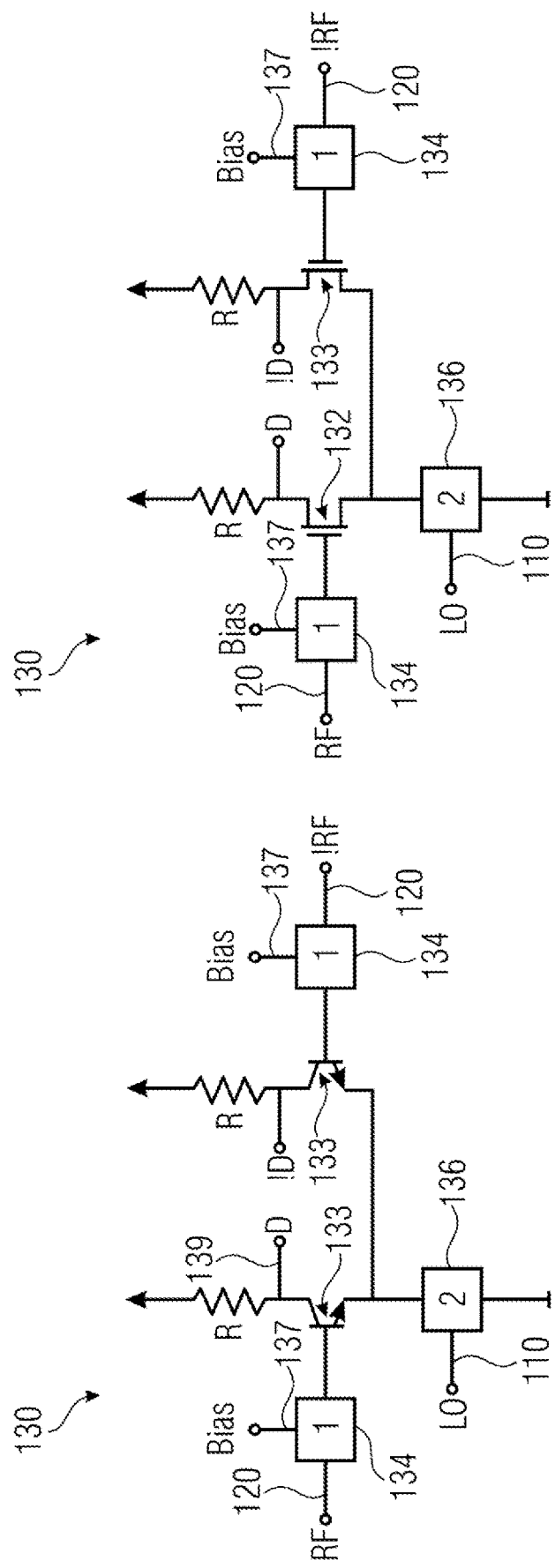

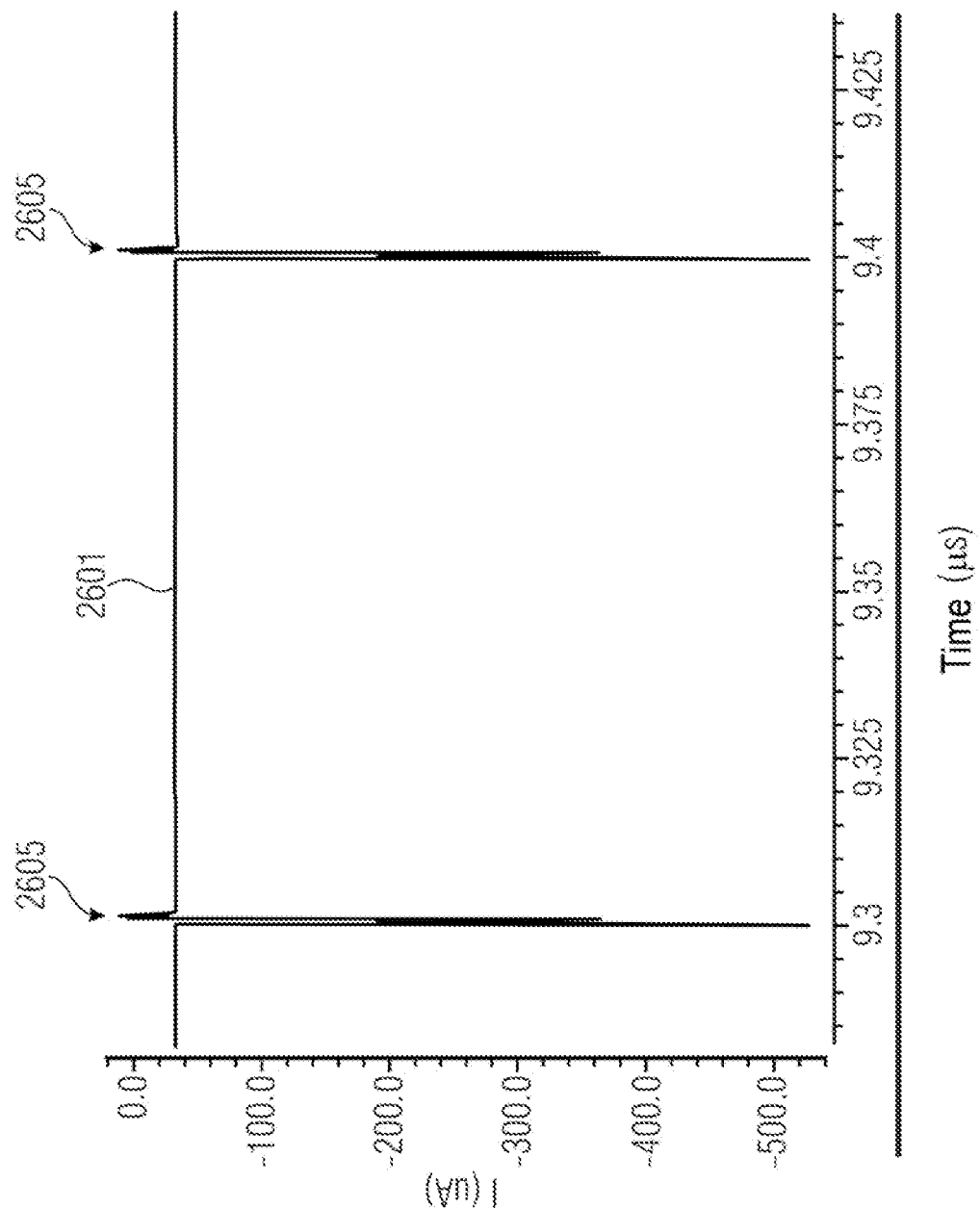

2700

```
┌─────────────────────────────────────┐
│   Receive the first input signal 110│──── 2701
│   and the second input signal 120   │
└─────────────────────────────────────┘
                  │
┌─────────────────────────────────────┐
│   Switch a mixer 130 on or off on the│──── 2702
│   basis of the first input signal 110│
└─────────────────────────────────────┘
                  │
┌─────────────────────────────────────┐
│  Mix the first and second input signals in │
│  order to generate a mixer output signal 139,│──── 2703
│  wherein a DC signal component of the mixer │
│  output signal 139 depends on whether the mixer│
│           130 is switched on or off          │
└─────────────────────────────────────┘
                  │
┌─────────────────────────────────────┐
│ Switch a downstream circuit on or off on the basis│──── 2704
│ of the DC signal component of the mixer output signal│
└─────────────────────────────────────┘
                  │
┌─────────────────────────────────────┐
│  Provide 2705 the output signal 190 on the basis│──── 2705
│         of the mixer output signal 139         │
└─────────────────────────────────────┘
```

Fig. 27

ELECTRICAL CIRCUIT, PULSE RADAR DEVICE, METHOD FOR PROVIDING AN OUTPUT SIGNAL, AND RADAR METHOD

CROSS REFERENCE TO RELATED APPLICATION

This application claims priority to German Patent Application No. 102020203841.4 filed on Mar. 25, 2020, the content of which is incorporated by reference herein in its entirety.

TECHNICAL FIELD

The present disclosure deals with an electrical circuit for providing an output signal based on a first and a second input signal and with a pulse radar device. Examples of the present disclosure relate to a method for providing an output signal based on a first and a second input signal and a radar method. Examples of the present disclosure relate to an integrated self-synchronized receiver for a sequential sampling pulse radar.

BACKGROUND

Electrical circuits are used, for example, to mix two input signals in order to generate an output signal based on the two input signals. Such electrical circuits are used in the signal analysis of radar systems, for example. One example of a radar system is a sequential sampling pulse radar (SSPR). SSPR is a radar concept which compensates for the demands imposed on the phase noise of a radio-frequency (RF) voltage-controlled oscillator (VCO) and has a reduced current consumption by virtue of the fact that it works with very short radio-frequency pulses, typically with a duty ratio of <1%. The entire transmitter and receiver can be completely switched off between the pulses. In addition, the SSPR concept reduces the complexity and the current consumption of the digital signal processing stage by virtue of the correlation functionality (generally the calculation of a fast Fourier transform in the digital domain) being embedded in the analog superstructure.

Chip-integrated solutions for SSPR receivers exist in the frequency range around 79 GHz. Furthermore, there are discrete assemblies which operate at 24 GHz. For example, a receiver uses a diode-based mixer in combination with a CMOS-based (complementary metal oxide semiconductor) transmission gate as a switch and a capacitor. The integrator consists of the output resistor of the mixer and the capacitor. In the presence of a pulse, the switch is closed and the capacitor is charged. In order to prevent discharge of the capacitor between the pulses, the switch is open in this time.

Further receivers use a self-biased mixer which is biased in such a manner that no collector current flows without a local oscillator (LO) signal. In the presence of an LO signal, the latter is rectified and drives a direct current, as a result of which the mixer is switched on. The switching four-element bundle of transistors is connected to a current mirror which implements a current output. The current mirror therefore drives a differential current into the integrating capacitor if the mixer is switched on. If the mixer is switched off, no current whatsoever flows and the mixer output constitutes an open circuit for the capacitor in this sense, exactly like an open switch. These receivers have a gain of approximately 6 dB but only a 10 dB improvement in the signal-to-noise ratio in comparison with the receivers described above.

BRIEF DESCRIPTION

An electrical circuit is described herein for providing an output signal based on two input signals which provides an improved compromise between a high gain, a good signal-to-noise ratio, a low amount of implementation outlay, a high degree of insensitivity to phase noise and a low current consumption.

Examples of the present disclosure provide an electrical circuit for providing an output signal based on a first and a second input signal. The electrical circuit has a mixer which is configured to receive and mix the first and second input signals in order to generate a mixer output signal and to switch on or off based on the first input signal, wherein a DC signal component of the mixer output signal depends on whether the mixer is switched on or off. The electrical circuit also has a downstream circuit which is configured to switch on or off based on the DC signal component of the mixer output signal and to provide the output signal based on the mixer output signal.

Examples of the present disclosure therefore provide a way of processing the mixer output signal using the downstream circuit in order to generate the output signal and to simultaneously switch the downstream circuit on or off in sync with the mixer output signal. Since the DC signal component of the mixer output signal is based on the first input signal, both the mixer and the downstream circuit can consequently be switched on or off based on the first input signal, with the result that a power consumption of the mixer and of the downstream circuit can be automatically adapted to the first input signal. This makes it possible to keep a current consumption of the electrical circuit low even if the downstream circuit has an active assembly for processing the mixer output signal. This expands the possible ways of processing the mixer output signal, in particular for applications in which the available energy or an average available power for supplying the electrical circuit is limited or is intended to be kept low. Synchronization of the downstream circuit using the DC signal component of the mixer output signal in this case provides a particularly precise possible way of synchronizing the downstream circuit with the first input signal since the DC signal component is based on the first input signal. Therefore, the electrical circuit is not dependent on a separate clock signal for synchronization, which clock signal may be susceptible to phase noise (or jitter). As a result of the synchronization using the first input signal, the electrical circuit is particularly robust with respect to phase noise. The electrical circuit can therefore achieve a particularly good signal-to-noise ratio, for example even if the first and second input signals are intended to be analyzed, for example integrated, over a long period. For example, in applications such as the pulse radar or SSPR mentioned at the outset, it may be desirable to integrate and/or amplify the mixer output signal in order to obtain the output signal. A high gain of the mixer output signal, for example, can be ensured using synchronized switching-on and switching-off using an amplifier of the downstream circuit, with the result that the output signal can have a high signal-to-noise ratio.

Further examples of the present disclosure provide a pulse radar device. The pulse radar device has at least one pulse generator which is configured to provide a pulsed transmitter signal and a pulsed local oscillator signal based on one or more oscillators signals, wherein the pulse radar device is configured to output the transmitter signal and to receive a receiver signal which is based on an echo of the transmitter signal. The pulse radar device also has the electrical circuit for determining an output signal based on a first and a second input signal, wherein the first input signal is based on the pulsed local oscillator signal and the second input signal is based on the receiver signal, and wherein the output signal constitutes an intermediate frequency signal of the local oscillator signal and the receiver signal.

Further examples of the present disclosure provide a method for providing an output signal based on a first and a second input signal. The method comprises: receiving the first and second input signals; switching a mixer on or off based on the first input signal; mixing the first and second input signals in order to generate a mixer output signal, wherein a DC signal component of the mixer output signal depends on whether the mixer is switched on or off; switching a downstream circuit on or off based on a DC signal component of the mixer output signal; providing the output signal based on the mixer output signal.

Further examples of the present disclosure provide a radar method comprising: providing a pulsed transmitter signal and a pulsed local oscillator signal based on one or more oscillator signals; outputting the transmitter signal at an antenna; receiving a receiver signal which is based on an echo of the transmitter signal from an antenna; receiving the output signal using the method for providing an output signal based on a first and a second input signal, wherein the first input signal is based on the pulsed local oscillator signal and the second input signal is based on the receiver signal, and wherein the output signal constitutes an intermediate frequency signal of the local oscillator signal and the receiver signal.

BRIEF DESCRIPTION OF THE DRAWINGS

Examples of the disclosure are described below with reference to the accompanying figures, in which:

FIGS. 2*a-f* show circuit diagrams of different examples of a mixer, FIG. 26 shows a graph with an example of a current consumption of a holding circuit, FIG. 27 shows a flowchart of an example of a method for providing an output signal based on a first and a second input signal.

DETAILED DESCRIPTION

Examples of the present disclosure are described below in detail and using the accompanying descriptions. Many details are described in the following description in order to provide a more in-depth explanation of examples of the disclosure. However, it is obvious to experts that other examples can be implemented without these specific details. Features of the different examples described can be combined with one another unless features of a corresponding combination exclude one another or such a combination is expressly excluded.

It is pointed out that identical or similar elements or elements which have the same functionality can be provided with identical or similar reference signs or can be denoted in an identical manner, in which case a repeated description of elements which are provided with identical or similar reference signs or are denoted in an identical manner is typically omitted. Descriptions of elements which have identical or similar reference signs or are denoted in an identical manner are interchangeable.

Figure 1:
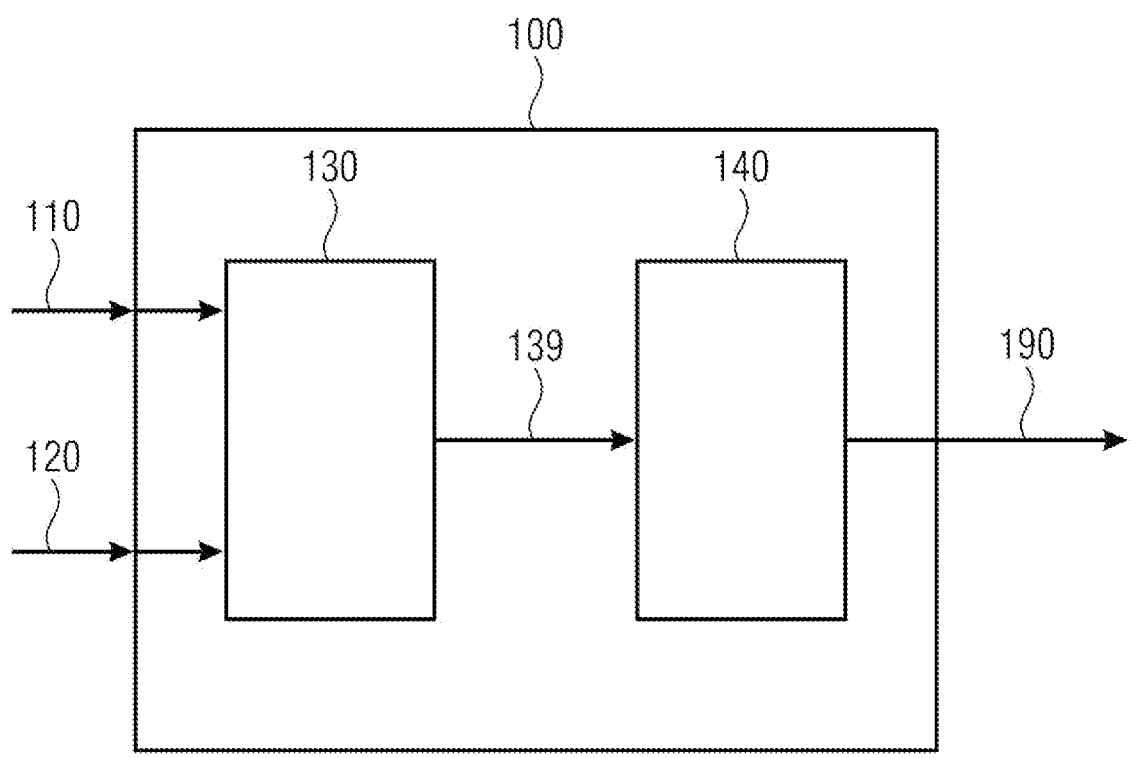
FIG. 1 shows a schematic illustration of an example of an electrical circuit.

FIG. 1 shows a schematic illustration of an example of an electrical circuit 100. The electrical circuit 100 is configured to receive a first input signal 110, for example a reference signal or a local oscillator signal, and a second input signal 120. The electrical circuit 100 is configured to provide an output signal 190 based on the first input signal 110 and the second input signal 120. The electrical circuit 100 has a mixer 130 which is configured to receive and mix the first and second input signals 110, 120 order to generate a mixer output signal 139. The mixer 130 is also configured to switch on or off based on the first input signal 110. A DC signal component of the mixer output signal 139 depends on whether the mixer 130 is switched on or off. The electrical circuit 100 also has a downstream circuit 140 which is configured to switch on or off based on the DC signal component of the mixer output signal 139 and to provide the output signal 190 based on the mixer output signal 139. For example, the mixer 130 can be switched on or off based on an amplitude or a power or a signal level of the first input signal 110. The switching-on or switching-off may relate in this case to a change between a switched-on state and a complementary switched-off state, wherein the switched-off state may be characterized, for example, by the fact that a power consumption of the mixer 130 or of the downstream circuit 140 is very low in the switched-off state, for example below a power loss threshold of the switched-off state. The switched-off state may also be characterized, for example, by the fact that no current or a very low current flows to an input and/or an output of the mixer 130 or of the downstream circuit 140 in the switched-off state.

The DC signal component of the mixer output signal 139 may be in some examples a DC component or a DC voltage component of the mixer output signal 139, in particular if the electrical circuit 100 is implemented in such a manner that signals are transmitted in an asymmetrical manner (signal ended). In the case of symmetrical (differential) signal transmission of the electrical circuit 100, the DC signal component may be a common mode component.

For example, the first input signal 110 may have a sequence of pulses, on the basis of which the output signal 190 is intended to be provided. It may therefore be expedient to switch off the electrical circuit 100 between the pulses of the first input signal 110 in order to keep a current consumption of the electrical circuit 100 as low as possible. Furthermore, the second input signal 120 may also have a sequence of pulses, on the basis of which the output signal 190 is intended to be provided.

In examples, the DC signal component of the mixer output signal 139 has a first level if the mixer 130 is switched on and a second level if the mixer 130 is switched off. The downstream circuit 140 can therefore switch on or off based on the level of the mixer output signal 139, as a result of which the downstream circuit 140 can be switched on and off in a very precise manner in sync with the first input signal 110 and the mixer 130. Since the DC signal component of the mixer output signal 139 is dependent on the first input signal 110, it is therefore possible to achieve the situation in which the downstream circuit 140 switches on or off in sync with the mixer 130 and on the basis of the first input signal 110.

In examples, the difference between the first level and the second level is in a range between 100 mV and 5 V or in a range between 0.5 V and 1.5 V, for example 1.1 V. A level difference between the first level and the second level in this range makes it possible to switch semiconductor components of the downstream circuit 140 on and off in a particularly effective manner, for example. A small level difference can ensure fast switching, for example, while a larger level difference can reduce a power loss in the switched-off state. In the case of a medium level difference, for example in a range between 0.5 V and 1.5 V, both criteria can be satisfied to a sufficient extent.

FIG. 2 shows circuit diagrams of different examples of the mixer 130 in implementations for symmetrical or asymmetrical signal transmission. The mixer 130 may have one or more transistors, for example one or more bipolar transistors 133 or one or more field-effect transistors 132. The mixer 130 may also have a first input circuit 136 at an input for the first input signal 110 (for example an LO signal) and a second input circuit 134 at an input for the second input signal 120 (for example an RF signal). The first and second input circuits 134, 136 are used, for example, to match an impedance of the mixer 130 to the first and/or second input signal 110, 120. The first and second input circuits 134, 136 may also be configured to provide a bias voltage for the mixer 130, for example in order to bias one or more transistors of the mixer 130. Both the first and the second input circuit 134, 136 may contribute to the bias voltage as well as to a matching network. The first input circuit 136 may comprise, for example, an emitter degeneration resistor which has a stabilizing effect on the current in the switched-on state and, on the other hand, influences an impedance of the mixer 130 for an RF signal (for example the first or second input signal) and therefore belongs to the matching network. A similar situation applies to the second input circuit 134 which can superimpose a common mode bias voltage on the second input signal 120 and can simultaneously match the impedance of the mixer 130.

In examples, the mixer 130 has at least one transistor 132, 133, wherein the transistor is biased in such a manner that the transistor is switched off if the power of the first input signal 110 is below an input threshold value and is switched on if the power of the first input signal 110 is above the input threshold value, and wherein the mixer 130 is configured to provide the DC signal component of the mixer output signal 139 based on a DC component of a current through the transistor 132, 133.

A suitable bias voltage of the transistor 132, 133 therefore makes it possible to switch the mixer 130 on or off based on the first input signal 110 and to provide the DC component of the mixer output signal 139 based on the first input signal 110. Furthermore, a suitable bias voltage makes it possible to achieve the situation in which a current consumption of the mixer 130 is particularly low in the switched-off state.

Figure 2D:
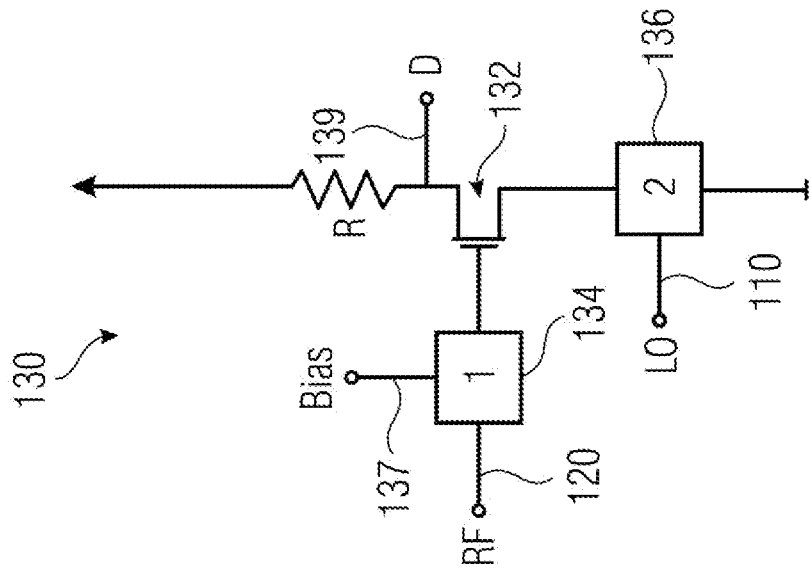
Figure 2C:
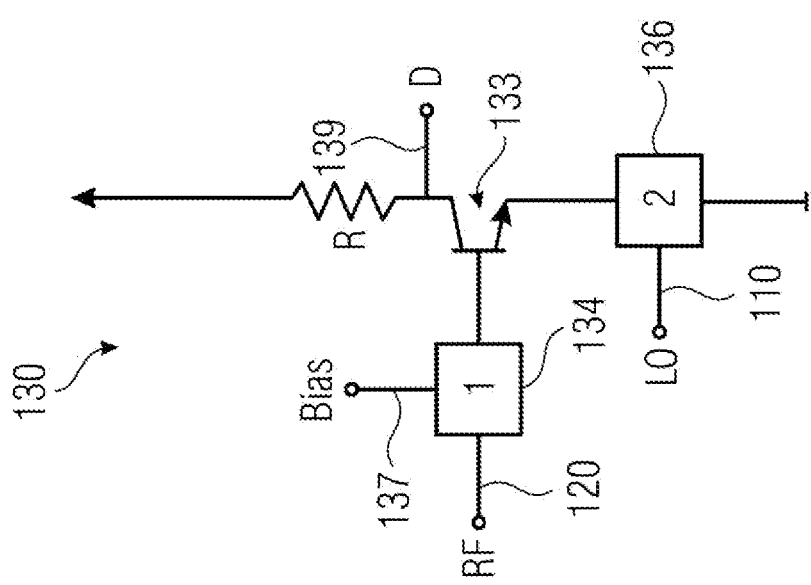

For example, in addition to the first input signal 110, which can correspond to an LO signal for example, and the second input signal 120, which can correspond to an RF signal for example, the mixer 130 may receive a bias voltage 137. The bias voltage 137 can be used to bias the one or more transistors 132, 133 in such a manner that the transistors 132, 133 are switched either on or off based on the first input signal 110. FIG. 2a and FIG. 2b show implementations of the mixer 130 in which the mixer 130 receives both the first input signal 110 and the second input signal 120 in differential form. FIG. 2c and FIG. 2d each show an implementation of the mixer 130 in which both the first input signal 110 and the second input signal 120 are provided to the mixer 130 in asymmetrical signal transmission. FIG. 2e and FIG. 2f each show an implementation of the mixer 130 in which the second input signal 120 is provided in a symmetrical signal transmission form and the first input signal 110 is provided in an asymmetrical signal transmission form. FIG. 2a, FIG. 2d and FIG. 2f show implementations with field-effect transistors, for example NMOS transistors. The complementary structures can be used for a PMOS implementation. FIG. 2b, FIG. 2c and FIG. 2e show implementations of the mixer 130 having one or more NPN bipolar transistors 133. However, PNP transistors can also be used in a complementary manner to the structures shown. In the variants of the mixer 130 for differential signal transmission, the first and second input circuits 136, 134 can each be separated or can be integrated in their differential variants. The first and second input circuits 136, 134 can be implemented according to the use of the electrical circuit 100 or of the first and second input signals 110, 120 and the mixer output signal 139.

Figure 3:
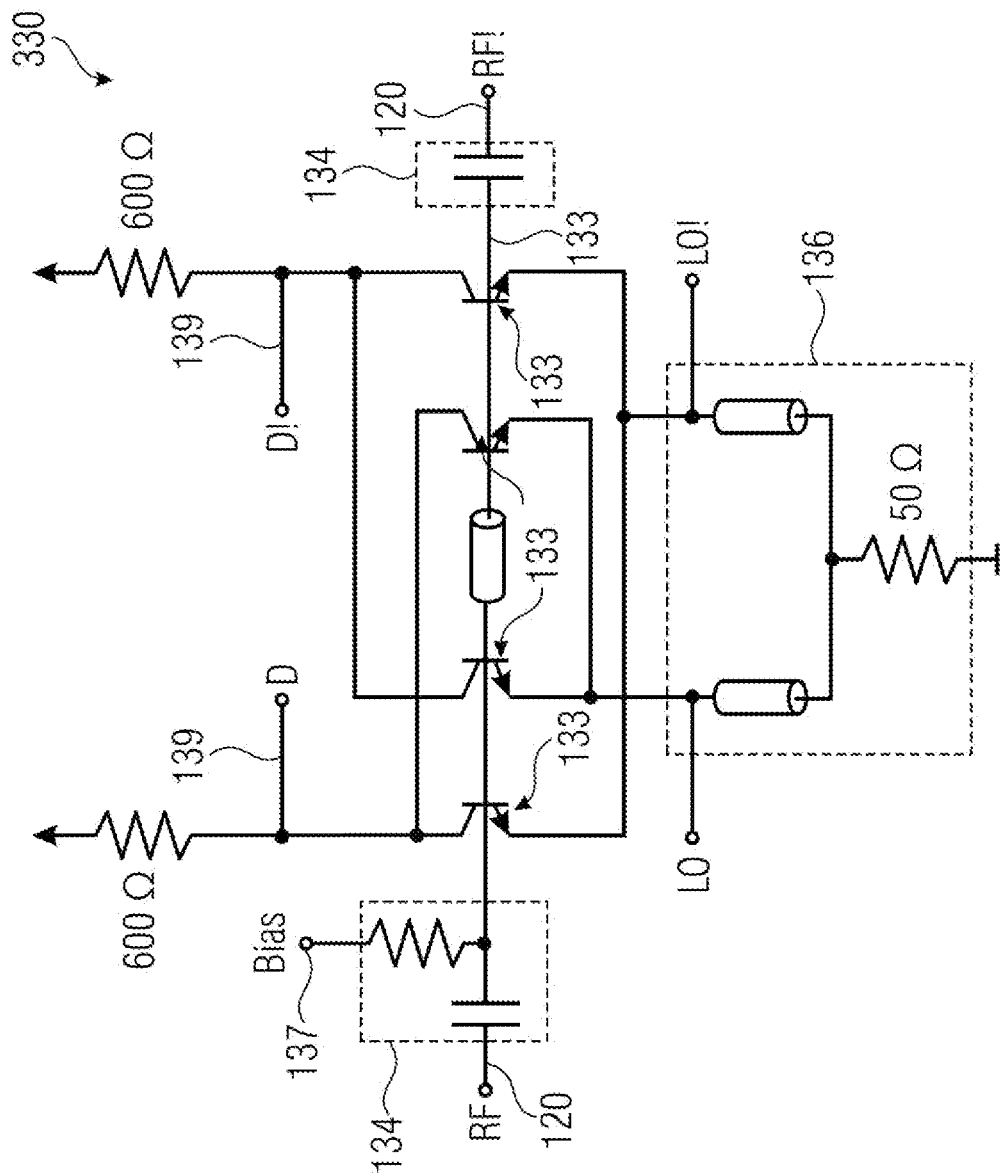
FIG. 3 shows a circuit diagram of a further example of a mixer.

FIG. 3 shows a circuit diagram of a mixer 330 according to one example implementation. The mixer 330 is configured to receive the first input signal 110, which can correspond to an LO signal, and the second input signal 120, which can correspond to an RF signal, in differential form and to provide the mixer output signal 139 in differential form. The mixer 330 is implemented with bipolar transistors 133, but may also be similarly implemented with field-effect transistors. The second input circuit 134 of the mixer 330 has a resistor and a capacitor. The first input circuit 136 of the mixer 330 also comprises a resistor and two inductances. For example, the first and second input circuits 136, 134 can form, in conjunction with a transmission line which connects the bases of the transistors 133, a matching network.

In examples, the mixer 130, 330 is configured to modulate the current through the transistor 132, 133 based on at least the second input signal 120 in the switched-on state and to provide the mixer output signal 139 based on the current through the transistor 132, 133.

For example, the mixer 130, 330 is configured to modulate the DC component of the current through the transistor 132, 133, on which the DC signal component of the mixer output signal 139 is based, based on the first input signal 110 and/or the second input signal 120. For example, the modulation of the current through the transistor can cause a counter-current component of the current through the transistor, based on which the mixer 130, 330 can provide a useful signal component of the mixer output signal 139. The useful signal component of the mixer output signal 139 may be represented, for example, by a common mode component, a counter-current component or a counter-voltage component in the useful signal of the mixer output signal 139.

Modulating the current through the transistor 132, 133 therefore makes it possible to provide the mixer output signal 139 in such a manner that it comprises both the DC signal component for switching the downstream circuit on and off and a useful signal component which represents, for example, a mixed signal based on a superimposition of the first input signal 110 and the second input signal 120 and based on which the output signal 190 can be provided, for example. The mixer 130, 330 therefore constitutes a particularly simple and low-loss circuit for providing both a useful signal and a switching signal, specifically the DC signal component, at an output of the mixer 130, 330 based on the first and second input signals 110, 120. As a result, it is possible for the downstream circuit 140 to provide the output signal 190 based on the mixer output signal 139 and to be switched on and off in sync with the first input signal 110 or the mixer 130, 330.

In other words, the proposed implementations of the mixer 130 can have the advantage that they enable very accurate synchronization of the switching-on and switching-off with an LO signal, for example the first input signal, and make it possible to completely switch off the mixer 130 between the pulses. This is achieved using the implementation of the mixer 130 using the one or more transistors 132, 133 which, in contrast to an implementation with diodes, can be completely switched off.

In other words, the electrical circuit 100 may comprise self-synchronization which is based on the fact that the DC signal component of a self-biased mixer reflects the applied power of the first input signal. This can be used, for example, to control a holding stage.

In examples, the first input signal 110 and the second input signal 120 each have a sequence of pulses which represent, for example, an envelope of a signal at a signal frequency or carrier frequency. Examples of the electrical circuit 100 which are described below can be used, for example, to determine a temporal correlation, for example a propagation time difference or a temporal offset, between the first input signal 110 and the second input signal 120. For example, the electrical circuit 100 can be used to determine an intermediate frequency signal of the first input signal 110 and of the second input signal 120. For this purpose, it may be expedient, for example, to integrate the mixer output signal 139. Such examples of the electrical circuit 100 can be used, for example, in conjunction with pulse radar devices, for example with the SSPR mentioned at the outset, and can also be referred to as receivers in this context.

Figure 5:
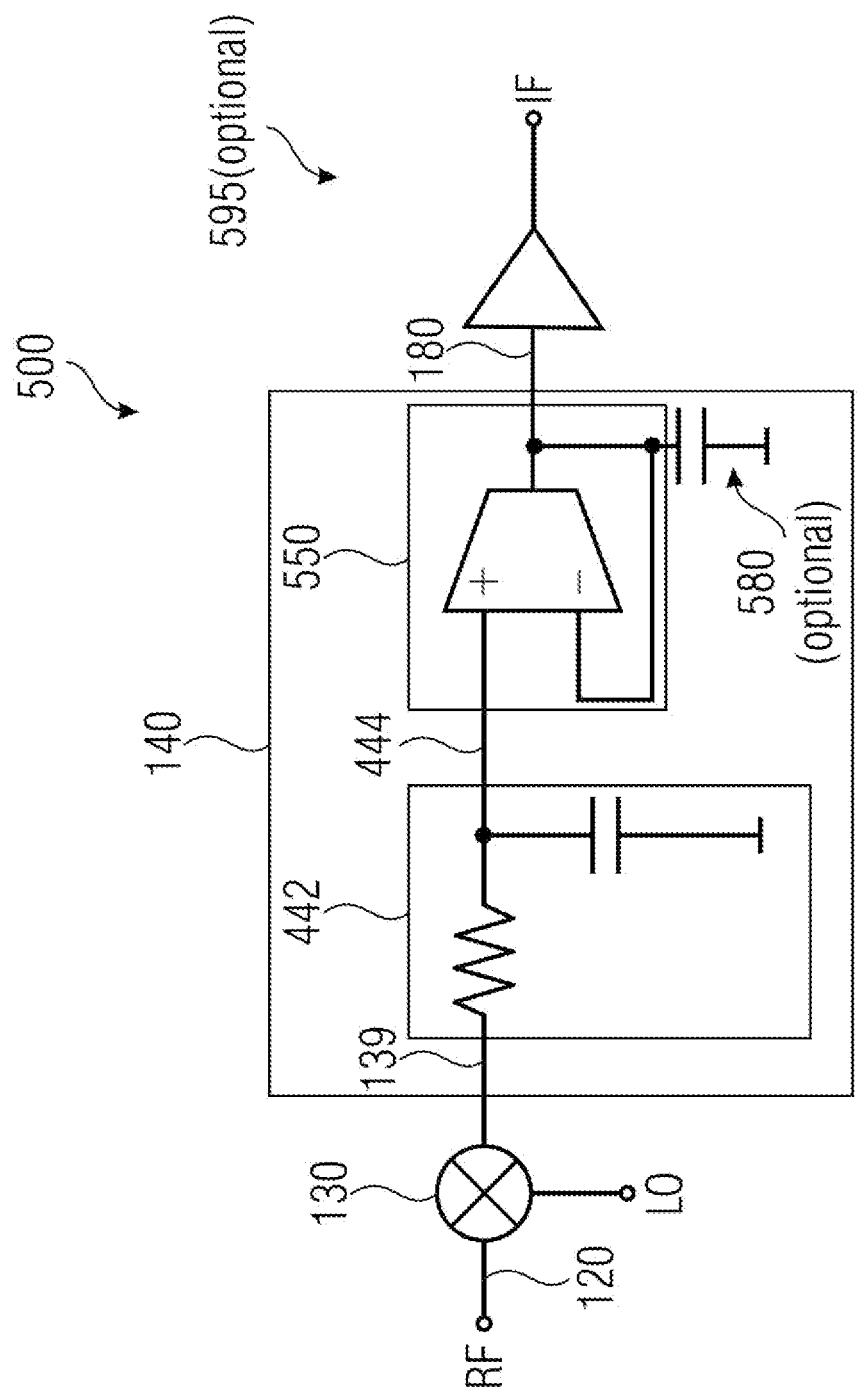
FIG. 5 shows a schematic illustration of a further example of an electrical circuit.

FIG. 5 shows a schematic illustration of an example of an electrical circuit 500. The electrical circuit 500 may correspond to the electrical circuit 100 according to FIG. 1. The electrical circuit 500 has the mixer 130 and the downstream circuit 140. The downstream circuit 140 may have a short-time integrator 442 which is illustrated as a low-pass filter, by way of example, in FIG. 5 but may also have a different implementation. Furthermore, the downstream circuit 140 may have a differential amplifier 550 which is configured to provide the output signal 190 based on an integrator output signal 444.

For example, the mixer 130, 330 is configured to switch on or off based on the presence of a pulse of the first input signal 110 at an input of the mixer 130, 330 and to accordingly provide the DC signal component of the mixer output signal 139. Therefore, the DC signal component of the mixer output signal 139 may have pulses with a pulse duration corresponding to the pulse duration of the first input signal 110, taking into account a transfer function of the mixer 130, 330.

In examples, the short-time integrator 442 of the downstream circuit 140 is configured to provide an integrator output signal 444 based on the mixer output signal 139, wherein an amplitude of a useful signal component of the integrator output signal 444 depends on a temporal overlap of a pulse of the first input signal 110 and a pulse of the second input signal 120.

For example, the short-time integrator 442 may provide the integrator output signal 444 based on a useful signal component of the mixer output signal 139. For example, the short-time integrator 442 can integrate or filter the useful signal component of the mixer output signal 139, which is represented by a push-pull signal or a counter-current or a counter-voltage, in order to provide the useful signal component of the integrator output signal 444. Since the useful signal component of the integrator output signal 444 signals the temporal overlap of two pulses of the first and second input signals 110, 120, the useful signal component of the integrator output signal 444 makes it possible to determine an intermediate frequency signal of the first input signal 110 and the second input signal 120.

Figure 4:
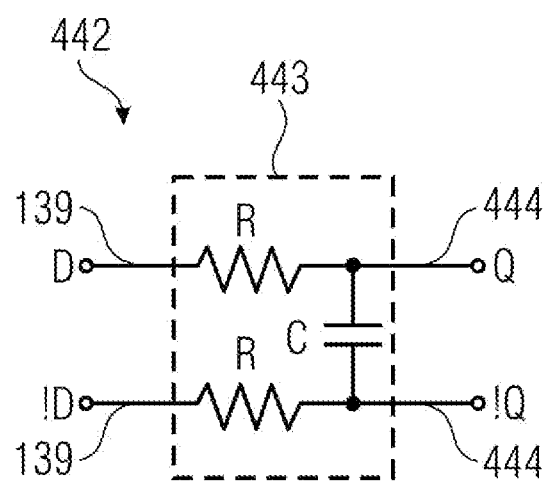
FIG. 4 shows a circuit diagram of an example of a short-time integrator.

The short-time integrator 442 can be implemented in such a manner that it approximates a linear step response of an ideal integrator as well as possible. A low-pass filter, as shown in FIG. 4, can be used for this purpose, for example. Alternatively, however, other approximations, for example time/voltage converters, or higher-order filters can also be used. A time constant of the integrator can determine how well the output signal 190 matches a mathematical model for the intermediate frequency signal and how much gain is achieved by the receiver (electrical circuit 100). A high gain of the receiver makes it possible to achieve, for example, a high signal-to-noise ratio of the output signal 190, which may be advantageous for a range or signal quality of a pulse radar device. The implementation of the short-time integrator 442 is not limited to the example shown in FIG. 4. It is also possible to use, for example, higher-order filters according to the uses of the application.

Figure 13:
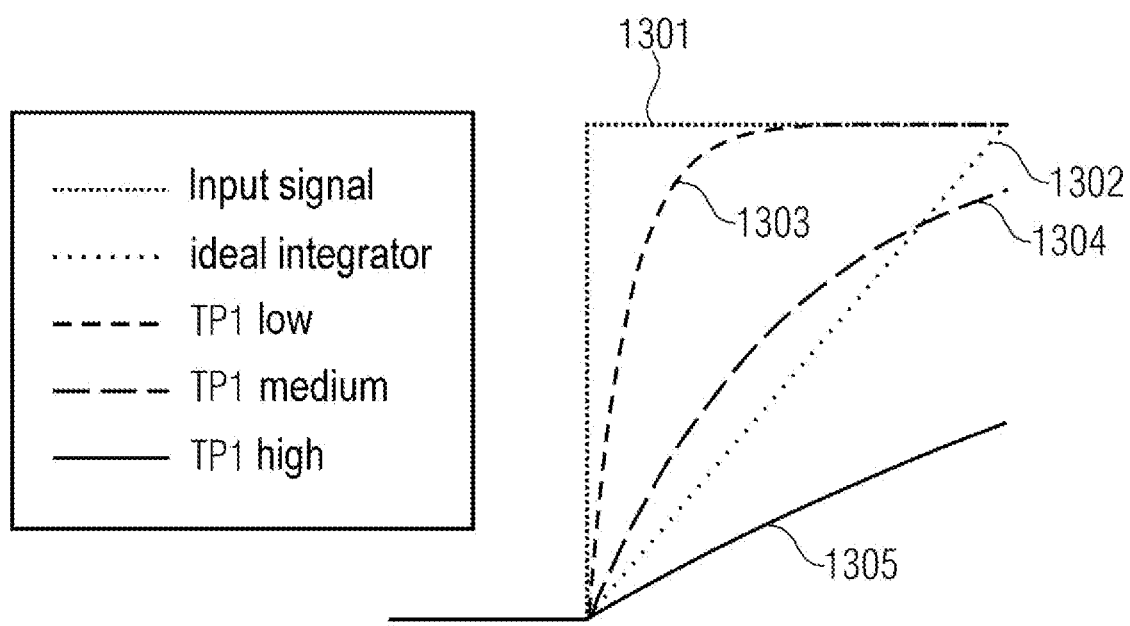
FIG. 13 shows a schematic illustration of an example of a response behavior of an integrator.

FIG. 13 shows a schematic illustration with examples of the response behavior of different integrators. The black dotted line shows a unit step representing, for example, an ideal form of the input signal, for example the mixer output signal 139. It may be desirable for the output signal from the integrator to come as close as possible to a step response 1302 of the ideal integrator, apart from a different gain, according to this step. The line 1303 shows a response behavior of an RC low-pass filter with a low time constant. The capacitor has already been fully charged with a very short pulse duration. The lower the time constant, the more the pulse shape at the output of the pulse radar changes into the envelope of the RF pulses. This can result in a different signal model. The line 1305 shows a response behavior of an RC low-pass filter with a high time constant. The capacitor is not fully charged even for a maximum overlap of the pulses, which corresponds to the pulse duration $T_P$, for example. As a result, although the output signal has the correct form, the incomplete charging results in a loss of signal amplitude. The line 1304 shows a response behavior of an RC low-pass filter with a medium time constant. A compromise between signal form and amplitude loss is selected, for example. The time constant is selected, for example, in such a manner that the voltage across the capacitor is 1 to 1.5 dB below the voltage when fully charged for a maximum overlap time. For example, the time constant of the short-time integrator 442 can be selected accordingly.

FIG. 4 shows a circuit diagram of an example of a short-time integrator 442. The example of the short-time integrator 442, as shown in FIG. 4, is implemented for symmetrical signal transmission. Other examples of the short-time integrator 442 are implemented for asymmetrical signal transmission.

In examples, the short-time integrator 442 has a low-pass filter 443. The low-pass filter 443 as a cut-off frequency which is higher than an inverse of a pulse duration (of an individual pulse) of the first and second input signals and is lower than a signal frequency or carrier frequency of the first and second input signals, with the result that the DC signal component of the mixer output signal remains substantially unfiltered.

The short-time integrator 442 can therefore integrate a useful signal component of the mixer output signal 139, which useful signal component is based on the first and second input signals 110, 120, in order to generate the useful signal component of the integrator output signal 444. If the low-pass filter 443 has a cut-off frequency which is higher than an inverse of the pulse duration of the first input signal 110, the DC signal component of the mixer output signal 139 can pass through the short-time integrator 444 in a substantially unfiltered form, with the result that the differential amplifier 550 can be switched on or off based on a DC signal component of the integrator output signal 444.

A low-pass filter is a particularly simple implementation of the short-time integrator and makes it possible to accurately select the time constant of the short-time integrator 442. Adapting the time constant of the low-pass filter 443 according to the application makes it possible to adapt a form of the integrator output signal 444 in such a manner that a radio-frequency component, for example a component at the signal frequency, is efficiently filtered by the low-pass filter 443. At the same time, the time constant of the low-pass filter 443 can be selected in such a manner that a loss, for example a power loss of the useful signal component of the integrator output signal 444 in comparison with a power of a useful signal component of the mixer output signal 139, may be particularly low. For example, the time constant can be selected as described with reference to FIG. 13.

In examples, the downstream circuit 140 also has a holding capacitance 580 which is coupled to an output of the downstream circuit for providing the output signal 190. The holding capacitance 580 can hold a voltage applied to an output of the differential amplifier 550 or can store a charge generated by the output signal 190 while the electrical circuit 500 is switched off, for example between two pulses of the first input signal 110. In other words, the holding capacitance 580 can be used as a store between two pulses and its charge can be reversed during a pulse. Holding the voltage or storing the charge makes it possible to achieve the situation in which the output signal 190 represents an intermediate frequency signal of the first and second input signals 110, 120.

The output signal 190 may be optionally transferred to an output stage 595, for example a driver stage or an analog/digital converter. The optional holding capacitance 580 may be part of the output circuit 595 in examples, for example a parasitic capacitance. In examples, the output stage 595 is configured to implement long-time integration in the digital domain. Alternatively, the long-time integration can also be omitted.

The differential amplifier 550 between the mixer 130 and the holding capacitance 580 or an output of the electrical circuit 500 makes it possible to amplify the integrator output signal 444 using the differential amplifier 550. For example, a power of the output signal 190 can be adapted to a desired output power of the electrical circuit 500 using the differential amplifier 550. In particular, this makes it possible to achieve the situation in which the power of the output signal 190 does not need to be completely provided by the mixer 130. As a result, the mixer 130 can be implemented with particularly low noise; for example, transistors 132, 133 of the mixer 130 can be selected to be particularly small. Furthermore, the mixer 130 can be implemented without a current mirror, thus improving a noise behavior. Since the integrator output signal 444 comprises an item of information relating to an overlap of two pulses of the first and second input signals 110, 120 in the form of an amplitude, an amplification stage can be implemented with low speed requirements downstream of the short-time integrator 442.

Figure 6:
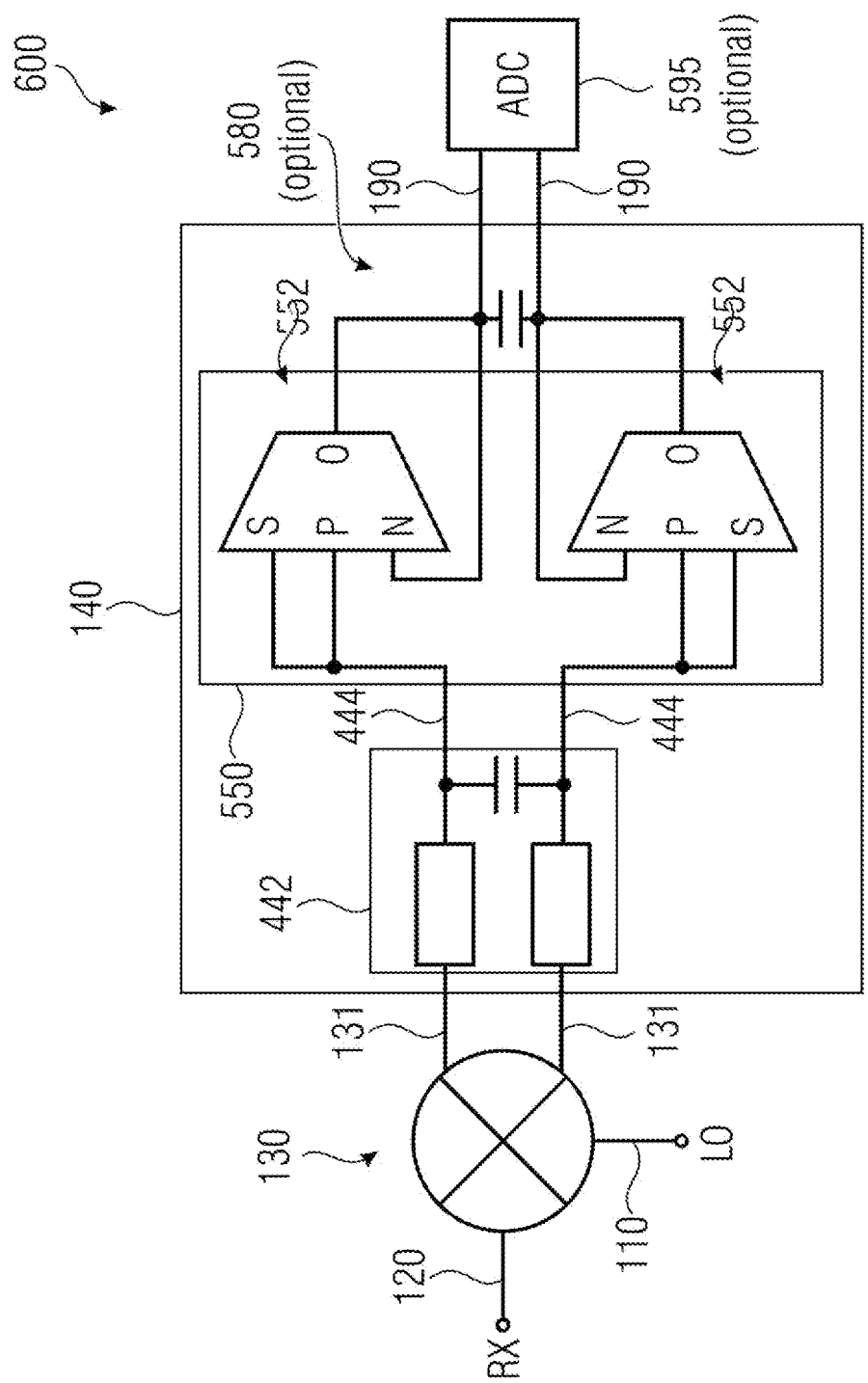
FIG. 6 shows a schematic circuit diagram of an example of an electrical circuit with symmetrical signal transmission.

FIG. 6 shows a schematic circuit diagram of an example of an electrical circuit 600 which may correspond to the electrical circuit 500. For example, the electrical circuit 600 is an implementation with symmetrical signal transmission. In the example shown, the differential amplifier 550 of the electrical circuit 600 has two differential amplifier circuits 552. The differential amplifier circuit 552 is configured to provide an output signal of the differential amplifier circuit 552 at an output O of the differential amplifier circuit 552 based on a difference between two signals applied to two inputs P and N of the differential amplifier circuit 552. The differential amplifier circuit 552 also has a switching input S. The differential amplifier circuit 552 is configured to switch on or off based on a DC signal component applied to the switching input S.

Accordingly, the downstream circuit 140 may also have a differential amplifier 550 which is configured to provide the output signal 190 based on the integrator output signal 444, wherein the differential amplifier 550 is configured to switch on or off based on the DC signal component of the integrator output signal 444.

Figure 7:
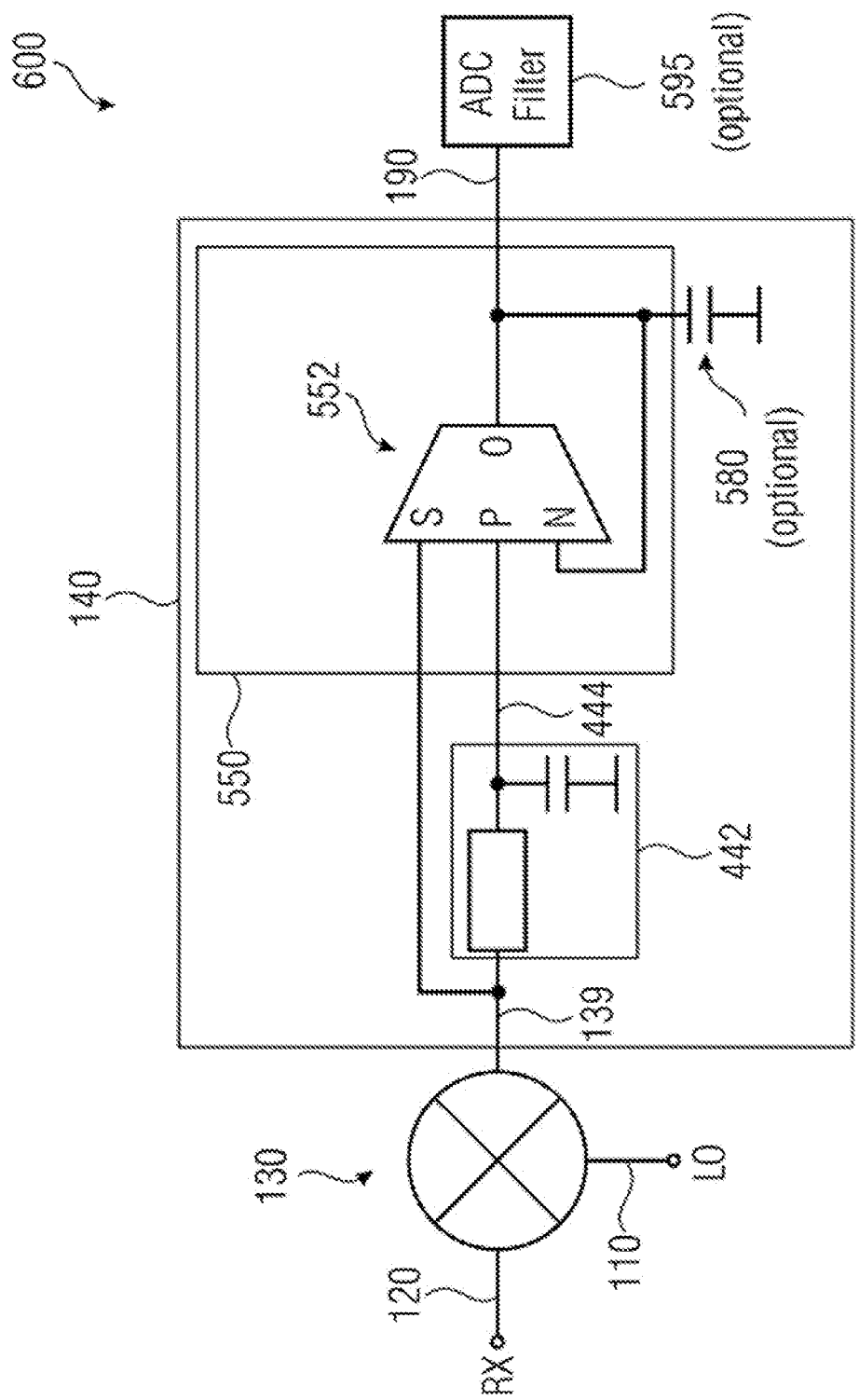
FIG. 7 shows a schematic circuit diagram of an example of an electrical circuit with asymmetrical signal transmission.

FIG. 7 shows a schematic circuit diagram of an example of an electrical circuit 700 which may correspond to the electrical circuit 500. The electrical circuit 700 may be an implementation with asymmetrical signal transmission of the electrical circuit 500. The differential amplifier 550 of the electrical circuit 700 has a differential amplifier circuit 552. The switch input S of the differential amplifier circuit 552 is connected to an output of the mixer 130 in order to receive the mixer output signal 139.

Accordingly, the downstream circuit 140 in examples also has a differential amplifier 550 which is configured to provide the output signal 190 based on the integrator output signal 444, wherein the differential amplifier 550 is configured to switch on or off based on the DC signal component of the mixer output signal 139.

For example, the short-time integrator 442 of the electrical circuit 700 may be implemented in order to filter the DC signal component and a useful signal component of the mixer output signal 139. As a result of the fact that the switching input S of the differential amplifier circuit 552 is connected to the mixer output signal 139, the differential amplifier 550 can be precisely switched on and off even if the integrator output signal 444 does not have a DC signal component or a DC signal component in the integrator output signal 444 is not suitable for switching the differential amplifier 550 on and off.

The optional output circuit 595 may have, in conjunction with the electrical circuit 700, a high-pass filter in order to filter a DC voltage component in the output signal 190.

As a result of the fact that the electrical circuit 500, 600, 700 is configured to switch on or off based on a DC signal component of the integrator output signal 444 or of the mixer output signal 139, a current consumption or a power consumption of the electrical circuit 500, 600, 700 can be reduced, for example by virtue of the differential amplifier 550 being switched on only when a signal or a pulse is present at an input of the mixer 130. This makes it possible to keep a current consumption or a power consumption of the electrical circuit 500, 600, 700 low and to simultaneously use the advantage of the differential amplifier 550.

In other words, the DC signal component of the mixer 130 can be used to synchronize an amplifier 550 with an LO signal, for example the first input signal 110 (wherein the amplifier may also be a switch) instead of using a complex circuit that is susceptible to faults for time control. In examples, the integration time is reduced by two orders of magnitude in comparison with conventional circuits, thus alleviating the problem of offset compensation and making it possible to use a passive integrator. Many different amplifier circuits can be used to implement the differential amplifier 550, for example. It is therefore possible to control the gain using feedback and even filtering. In examples, the complete receiver, for example the electrical circuit 100, 500, is switched off between the pulses.

Figure 8:
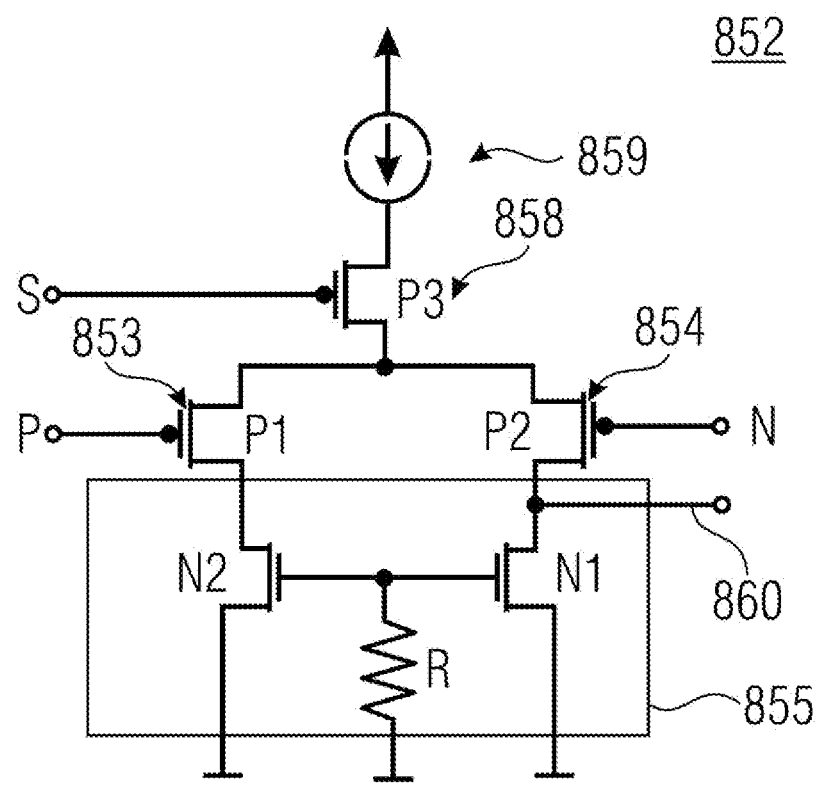
FIG. 8 shows a circuit diagram of an example of a differential amplifier circuit.

FIG. 8 shows a circuit diagram of an example of a differential amplifier circuit 852 which can correspond to the differential amplifier circuit 552, for example. The differential amplifier circuit 852 has a first transistor 853, which is connected to the first input P, and also has a second transistor 854 which is connected to the second input N of the differential amplifier circuit 852. The differential amplifier circuit 852 has a current mirror 855 in order to increase a gain factor of the differential amplifier circuit 852 at the asymmetrical output 860 or O of the differential amplifier circuit 852.

In examples, the differential amplifier 550 has at least one transistor 853, 854, wherein the transistor 853, 854 is switched either on or off depending on whether the DC signal component of the mixer output signal 139 is below or above a mixer signal threshold value. The transistor 853, 854 of the differential amplifier 550 can therefore be switched on or off based on the DC signal component of the mixer output signal 139, with the result that a current consumption of the differential amplifier 550 may be particularly low based on the first input signal 110.

In examples, the differential amplifier 550 is configured to hold a voltage applied to an output of the differential amplifier in the switched-off state. This makes it possible to prevent the holding capacitance 580 or the external capacitance from being discharged between two pulses of the first and/or second input signal 110, 120. Therefore, the differential amplifier 550 may also assume the function of a switch which can prevent the holding capacitance from being discharged, as a result of which the intermediate frequency signal can be determined in a particularly precise manner.

Instead of the differential amplifier 550, the electrical circuit 500 can also be implemented with a switch between the short-time integrator 442 and the holding capacitance 580 or an output of the circuit 500 or the output circuit 595, wherein the switch is configured to switch on or off based on the DC signal component of the integrator output signal 444.

In examples, the differential amplifier 550 has a switching transistor 858 arranged between a supply connection 859 and the at least one transistor 853, 854, wherein the switching transistor 858 is configured to switch to an on or off state depending on whether the DC signal component of the mixer output signal 139 or of the integrator output signal 444 is below or above a mixed signal threshold value.

A connection between the supply connection 859 and the transistor 853, 854 can therefore be blocked based on the mixer output signal 139 or the integrator output signal 444. In the off state, it is possible to prevent a current from flowing between the output 860 of the differential amplifier 550 and the supply connection 859, with the result that a voltage applied to the output 860 can be maintained. Since the differential amplifier 550 can be switched on or off in sync with the first input signal 110 or the mixer output signal 139, the differential amplifier 550 may constitute a switch in sync with the first input signal 110 between the holding capacitance and the mixer 130 or the short-time integrator 442.

Figure 9:
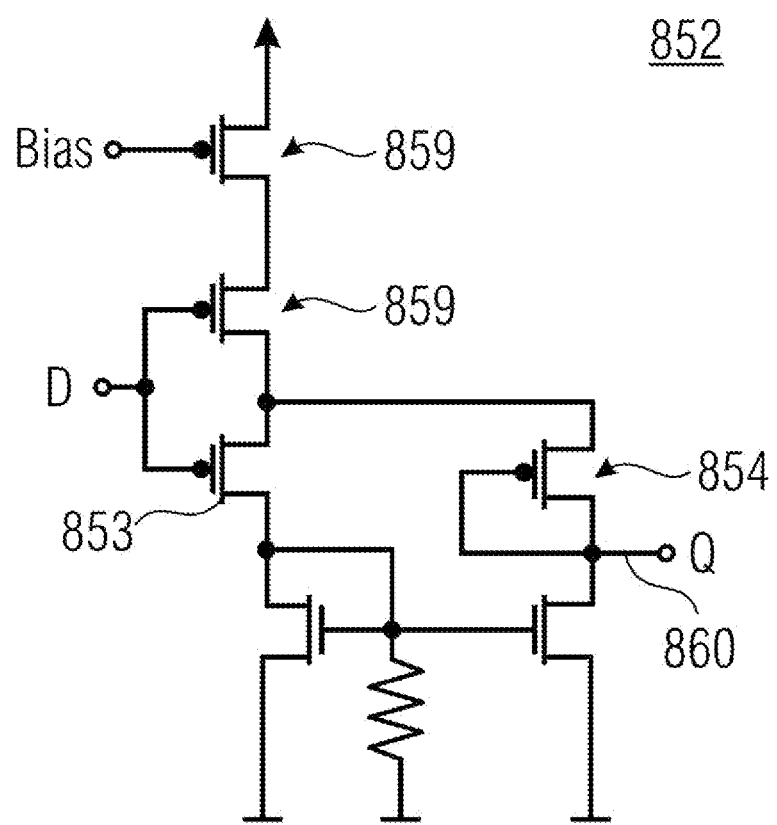
FIG. 9 shows a circuit diagram of a further example of a differential amplifier circuit.

FIG. 9 shows a circuit diagram of a further example of the differential amplifier circuit 852. In the example of the differential amplifier circuit 852, as shown in FIG. 9, the supply connection 859 is implemented using a bias voltage. Furthermore, as shown in connection with the differential amplifier circuit 552 of the electrical circuit 600, 700, the output 860 in the differential amplifier circuit 852 may be connected to the input N, with the result that the differential amplifier circuit 852, 552 has a gain factor of 1. Furthermore, the switching input S may be connected to the first input P, as may be the case in an implementation of the differential amplifier circuit 852 in the electrical circuit 600. For example, the current mirror may be implemented in PMOS.

Figure 10:
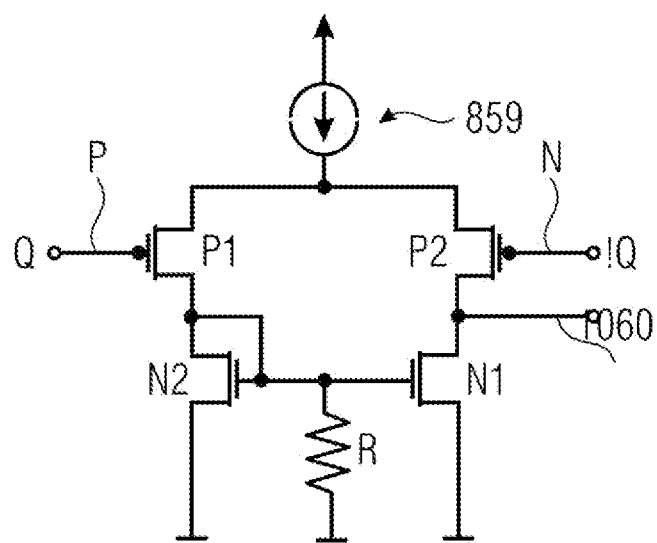
FIG. 10 shows a circuit diagram of an example of a differential amplifier circuit for symmetrical signals.
Figure 11:
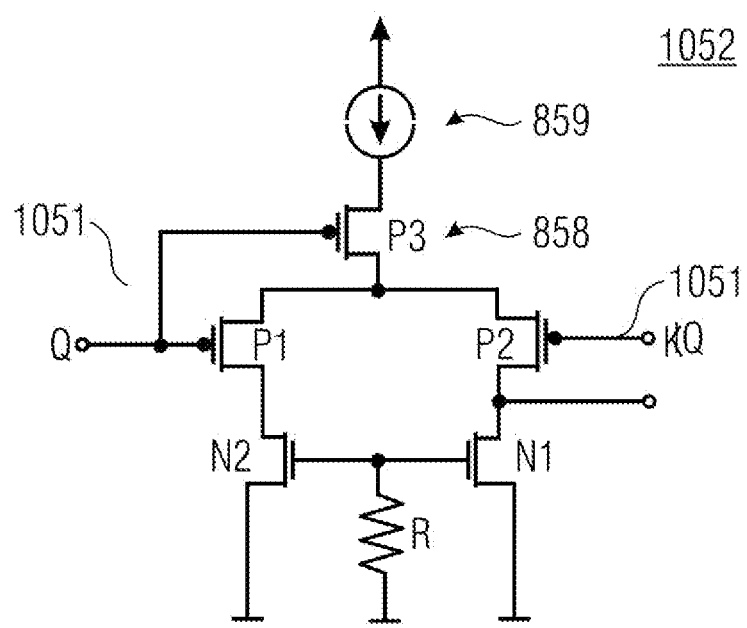
FIG. 11 shows a circuit diagram of a further example of a differential amplifier circuit for symmetrical signals.

FIG. 10 shows a further example of a differential amplifier circuit 1052 according to an example implementation which illustrates, for example, a basic concept for an amplifier and can correspond to the differential amplifier 550. The input stage of the amplifier has a differential pair of PMOS transistors P1-P2, but more complex input stages are also possible. If the mixer is switched off, the DC signal component at the inputs Q/!Q of the amplifier 1052 may have a high level, as a result of which the PMOS transistors can be switched off and no current flows. If the mixer 130 is switched on, the DC signal component at the inputs may be low and the transistors P1-P2 operate like a normal differential pair. The NMOS current mirror comprising the transistors N1-N2 provides a single-ended output K in an asymmetrical manner. Other implementations of the current mirror are also possible; in particular, those implementations which do not constitute an active current sink when the differential amplifier 550 is switched off are advantageous. The biased current source is shown as an ideal current source, but may also be implemented in a particularly advantageous manner using a bias voltage. If one of the inputs of the amplifier is used as feedback, an additional switch may therefore be used to prevent this input from remaining active when the amplifier is switched off. A further example of the differential amplifier circuit 1052 is shown in FIG. 11 in which the input Q is connected to an output of the mixer 130 or of the short-time integrator 442, whereas the input !Q can be used as a feedback input. The example shown in FIG. 11 also has a switching transistor 858 with a similar function to the switching transistor 858 of the differential amplifier circuit 852.

In examples, the differential amplifier 550 has a PMOS input stage, for example if the mixer 130 outputs a mixer output signal 139 with a low DC voltage component. Otherwise, the amplifier 550 may have an NMOS input stage.

Details, functions and advantages of the electrical circuit 100, 500, 600, 700 are described below in connection with a pulse radar device. However, it is to be noted that individual details of the details described can also be implemented in or apply to the electrical circuit 100, 500, 600, 700 if the electrical circuit is not part of a pulse radar device, but rather receives the first and second input signals 110, 120 from a pulse radar device, for example. Furthermore, the described details can also be used in connection with other applications and signals.

Figure 12:
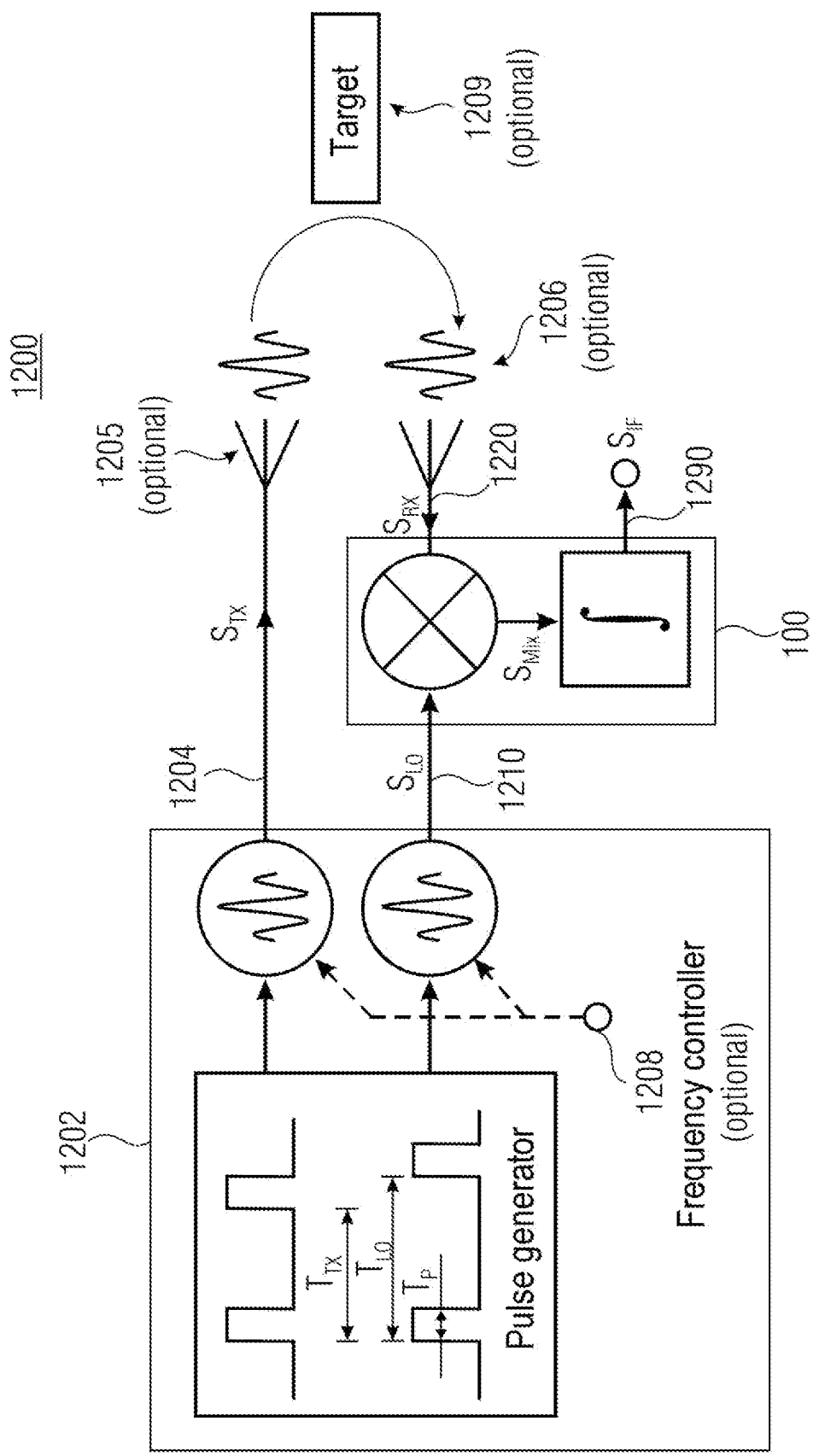
FIG. 12 shows a schematic illustration of an example of a pulse radar device.

FIG. 12 shows a schematic illustration of an example of a pulse radar device 1200. The pulse radar device 1200 has at least one pulse generator 1202 which is configured to provide a pulsed transmitter signal 1204 and a pulsed local oscillator signal 1210 based on one or more oscillator signals. For example, the pulse generator 1202 is configured to generate a first pulsed signal, which has pulses with a pulse width $T_P$ and an interval of time between two pulses $T_{TX}$ for example, and to also generate a second pulsed signal which has pulses with a second pulse width, which can likewise correspond to the pulse width $T_P$, and an interval of time between two pulses of $T_{LO}$. For example, the pulse generator 1202 can modulate the pulses of the first and second pulsed signals at a signal frequency, for example using an optional frequency controller 1208, in order to provide the pulsed transmitter signal 1204 and the pulsed local oscillator signal 1210.

The pulse radar device 1200 is configured to output the transmitter signal 1204 and to receive a receiver signal 1220 which is based on an echo of the transmitter signal 1204. For example, the pulse radar device 1200 has the optional antennas 1205 and 1206 in order to output the transmitter signal 1204 and to receive the receiver signal 1220. For example, the echo of the transmitter signal 1204 is based on a target object 1209, with the result that a time at which the receiver signal 1220 is received can be based on a distance between the pulse radar device 1200 and the target object 1209.

The pulse radar device 1200 also has the electrical circuit 100, 500, 600, 700, wherein the first input signal 110 is based on the pulsed local oscillator signal 1210 or corresponds to the latter and the second input signal 120 is based on the receiver signal 1220 or corresponds to the latter, and wherein the output signal 190 constitutes or corresponds to an intermediate frequency signal of the local oscillator signal 1210 and the receiver signal 1220.

In examples, the pulse rates of the pulsed local oscillator signal 1210, which are based on the interval of time $T_{LO}$ between two pulses of the LO signal for example, are $10^{-6}\%$ to $10^{-3}\%$ greater or less than a pulse rate of the pulsed transmitter signal 1204, which is based on the interval of time $T_{TX}$ between two pulses of the pulsed transmitter signal for example.

Since the receiver signal 1220 is based on an echo of the transmitter signal 1204, a frequency, a pulse rate and a pulse width of the receiver signal 1220 can correspond to the corresponding variables of the transmitter signal 1204. On account of the slightly different pulse rates of the receiver signal 1220 and of the LO signal 1210, it is possible to determine a propagation time difference between the LO signal 1210 and the receiver signal 1220 based on an intermediate frequency signal of the LO signal 1210 and the receiver signal 1220.

In examples, the pulse rate of the LO signal 1210 and of the transmitter signal 1204 or of the receiver signal 1220 is in a range between 1 MHz and 100 MHz. The signal frequency of the LO signal 1210 and of the receiver signal 1220 is, for example, in a range between 1 GHz and 200 GHz, for example in a range between 70 GHz and 90 GHz or in a range between 150 GHz and 170 GHz.

In examples, the frequency of the intermediate frequency signal 1290 is based on a difference between the pulse rates of the LO signal 1210 and the transmitter signal 1204.

In examples, a duty factor of the first input signal 110 (or of the LO signal 1210) and/or of the second input signal 120 (or of the receiver signal 1220), which is based, for example, on a ratio between a pulse width and an interval of time between two pulses of a pulsed signal, is less than 5%, for example less than 1%. As a result of a particularly low duty factor, the LO signal 1210 and the transmitter signal 1204 can be provided in a particularly low-power manner.

In examples, the first input signal 110 has a sequence of pulses, wherein the power of the first input signal 110 is above an input threshold value during a pulse and is below an input threshold value between two pulses.

For example, the electrical circuit 100 is configured to switch on or off depending on whether the power of the first input signal 110 is above or below the input threshold value. The electrical circuit 100 can therefore switch on or off independently, for example without receiving an additional clock signal for synchronization, based on the first input signal 110 or the LO signal 1210, wherein the electrical circuit 100 can be switched on in the presence of a pulse of the first input signal 110 at an input of the electrical circuit 100 for receiving the first input signal 110 and can be switched off in the absence of a pulse of the first input signal 110 at an input of the electrical circuit 100 for receiving the first input signal 110. As a result of a low duty factor of the first input signal 110, a particularly large amount of power can be saved by switching the electrical circuit 100 on and off in sync with the first input signal 110.

In other words, oscillators, which provide the signal frequency for the transmitter signal 1204 and the LO signal 1210 for example, can be set to identical frequencies, in which case a deviation of up to ±500 MHz with a loss of signal level of 3 dB can be tolerated. The pulse generator 1202 can control the pulse duration and the pulse repetition rate or the pulse rate. The pulse repetition rate of the LO signal is slightly different from the pulse repetition rate of the transmitter signal 1204, which results in a sliding overlap between the pulses. For example, very short phase-coherent 79 GHz pulses with slightly different pulse rates can be used. The LO signal 1210 and the receiver signal 1220 are provided to the mixer 130 of the electrical circuit 100 as the first input signal 110 and the second input signal 120. The mixer and integrator can correlate the pulse sequence of the RX and LO pulses, for example of the receiver signal 1220 and LO signal 1210. On account of the different pulse rates, a phase difference between the LO and RX pulses can rise linearly.

Therefore, a constant frequency or pulse rate can occur at an output of the mixer 130, for example in the mixer output signal 139.

The electrical circuit 100 is implemented in the pulse radar device 1200, for example as an electrical circuit 500, for example as an electrical circuit 600, 700. The mixer 130 of the electrical circuit 100 is configured to mix the LO signal 1210 and the receiver signal 1220. The mixer output signal 139 has short pulses, ideally square-wave pulses, for example. An integrator is used as a filter and is active as a holding stage between the collected pulses. One idea of the present disclosure is, for example, to divide the integrator into a short-time integrator and a long-time integrator. The short-term integration carries out, for example, the integration of an individual pulse, for example using a passive first-order low-pass filter. The integrator is implemented in the electrical circuit 500, for example using the short-time integrator 442 and the optional holding capacitance 580.

It may be desirable to switch off the receiver, for example the electrical circuit 100, between the short pulses in order to be able to use the advantages of the SSPR described at the outset and to keep the current consumption as low as possible. Active integrators with feedback are continuously on, and offset compensation over a measurement time of 10 ms with 1 ns pulses at a pulse rate of 10 MHz is difficult. Passive integrators in the sense of capacitors—combined with the output resistor of the mixer—provide an alternative but have the disadvantage of a discharge between the pulses. In order to prevent the capacitor, for example the holding capacitance 580 or a capacitance of the output circuit 595, from discharging, a type of switch can be used between the mixer and the capacitor. In this case, good synchronization between the LO pulses and the switching operation can considerably increase the performance of the receiver or may even be essential. Switching which is too early or too late may impair the gain. Additional transistors generally cause additional noise, which also impairs the performance of the system.

The electrical circuit 500 provides the possibility of solving this problem by dividing the integrator of a signal model of the SSPR into a short-time (individual-pulse) integrator and a long-time integrator. In this case, the long-time integrator can also be omitted without a disadvantage. For example, the bandwidth of the internal signal, for example the signal frequency, may be sufficiently narrow, such that the error caused by omitting the long-time integrator is small. For example, the signal model can be represented by the following formula:

$$y[n] = \sum_{k=-\frac{\beta}{2}}^{n-\frac{\beta}{2}-1} \cos(k\Omega_0) \int_{-\infty}^{\infty} ee(\xi, k)d\xi \quad (1)$$

The short-time integrator 442 can be configured to execute the integral in the second part of the formula, whereas the long-time integrator may have the function of summing the contributions of the individual pulses which are represented by the sum in the formula.

As described, the mixer 130 can independently switch on and off. In other words, the mixer 130 is self-biased and has no or a very low current consumption if no LO signal, for example a pulse of the LO signal 1210, is present. The RF front-end can therefore be switched off between the pulses. In this state, the mixer 130 may have a finite output resistance and a well-defined level of a DC voltage component of an output signal, for example the mixer output signal 139. In this state, the DC voltage component of the mixer output signal 139 is referred to as VCC, for example. In the presence of an LO signal, the mixer 130 can switch on and the DC voltage component can change, for example to 700 mV. An input stage of the amplifier, for example the differential amplifier 550, detects this change in the DC voltage component and switches the amplifier on. The holding capacitance 580 receives an output signal from the amplifier 550. When the LO pulse has passed, the mixer 130 can switch off and the DC voltage component of its output signal can return to the level in the off state of the mixer 130. The input stage of the amplifier 550 can detect this and can switch the amplifier 550 off. The holding capacitance 580 can store samples. The short-time integrator 442 may have any desired passive or active circuits which approximate the integration, for example as described in formula (1), to a sufficiently good extent. A simple first-order RC low-pass filter is shown here. As shown in FIG. 5 for example, the amplifier 550 may be implemented as a buffer with unit gain based on a transconductance amplifier (OTA), but more complicated amplifiers, even with feedback, are also possible. For example, as shown in FIG. 6 and FIG. 7, the amplifier 550 can be implemented with the aid of the differential amplifier circuits 852, 1052, wherein the gain factor of the differential amplifier circuit 852, 1052 can be changed by connecting a voltage divider between the output 860 and the transistor 854, for example in the implementation of the differential amplifier circuits 852 which is shown in FIG. 8.

Since the electrical circuit 100, 500, 600, 700 enables a variable configuration of the short-time integrator 442, good control of the time constant of the integrator can be enabled. As a result, the time constant of the integrator can be adapted very accurately to the LO signal 1210 and the receiver signal 1220, for example to a signal frequency and a pulse duration of the LO signal 1210 and of the receiver signal 1220.

An implementation of the amplifier 550 based on the proposed differential amplifier circuits 852, 1052 makes it possible to synchronize the amplifier 550 with the pulses at the mixer output, for example of the mixer output signal 139, in a very precise manner. Control of the switching transistor 858 using the DC signal component of the mixer output signal 139 or of the integrator output signal 444 can ensure that a charge which has built up during a pulse at the output of the amplifier 550 cannot flow away during the switched-off state of the electrical circuit 100, 500, 600, 700.

The proposed implementation of the differential amplifier 550 using the differential amplifier circuits 852 makes it possible to accurately set the gain using the included feedback loop.

For example, the mixer 130 may be implemented in the form of the mixer 330 in FIG. 3. For example, the bias voltage 137 can be selected in such a manner that the transistors 133 are switched off without an LO signal, with the result that no current flows, for example through the transistors 133, and the supply voltage is applied to the outputs 139. If an LO signal 1220 with a sufficiently high power is present as an input signal 110, the transistors 133 can switch on and a current can flow. The DC component of the current may result in a voltage drop across the load resistor, with the result that the DC voltage component at the outputs D/!D falls. For example, the structure of the mixer 330 may be selected in such a manner that the DC voltage component is approximately 800 mV in the switched-on state.

In examples, the pulse radar device 1200 is configured to obtain, based on the intermediate frequency signal 1290, an item of information relating to a period between the outputting of a pulse of the transmitter signal 1204 and the reception of an echo of the pulse as a receiver signal 1220.

Figure 14:
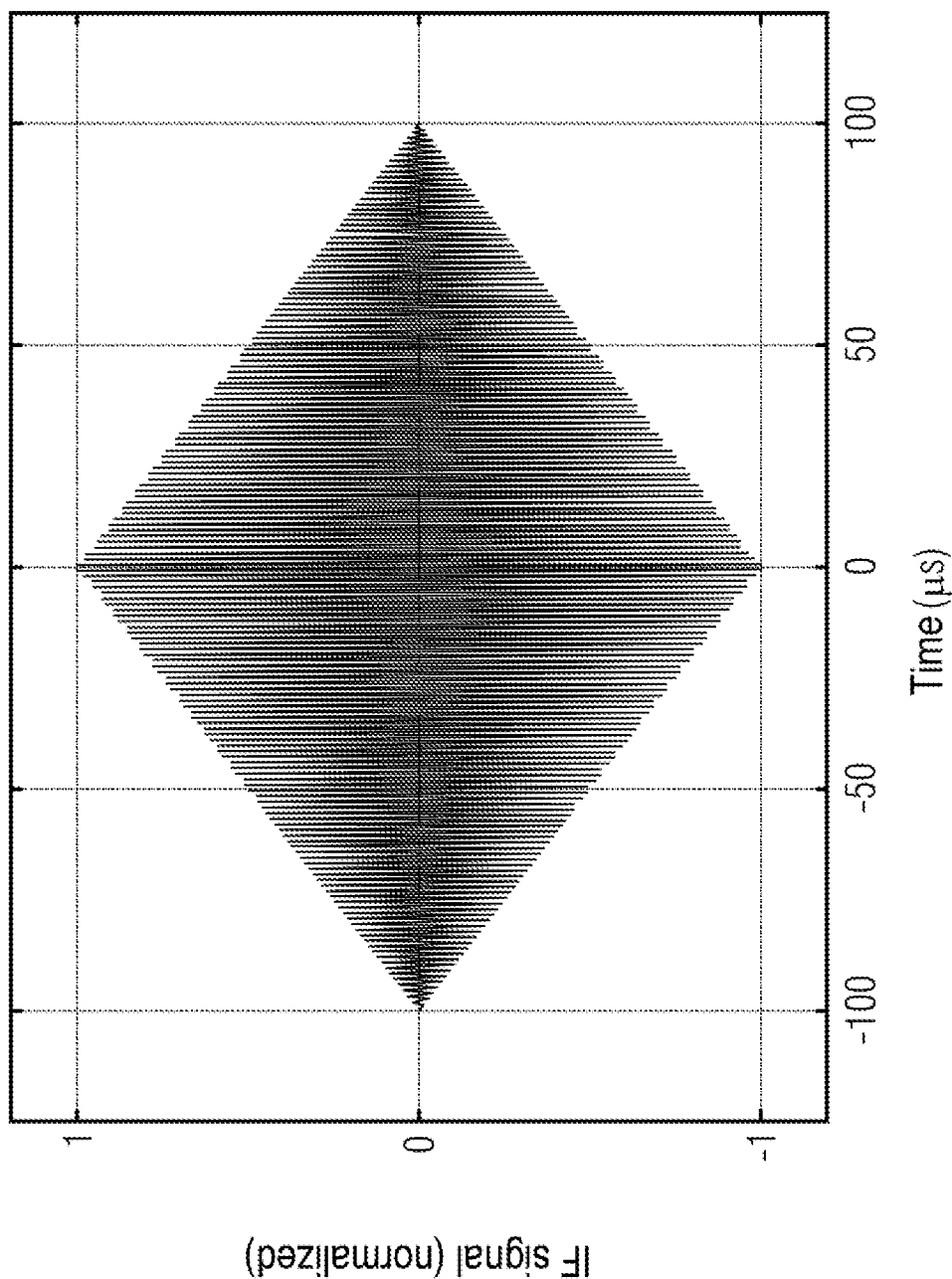
FIG. 14 shows a graph with an example of an intermediate frequency signal.

FIG. 14 shows a graph with an example of an intermediate frequency signal 1290. For example, a maximum of the intermediate frequency signal 1290, for example an envelope of the intermediate frequency signal 1290, can represent a propagation time difference between the LO signal 1210 and the receiver signal 1220, based on which the information relating to the period between the outputting of the pulse of the transmitter signal and the reception of the echo of the pulse as a receiver signal can be determined.

The form of the generated IF signal, for example the intermediate frequency signal 1290, may be based on the sliding overlap of an envelope of the RF pulses. In examples, the IF signal can be described by the following function:

$$s_{IF}[n] = A_0 g_{Mix} \sum_{k=-\lfloor \frac{\beta}{2} \rfloor}^{n-\lceil \frac{\beta}{2} \rceil -1} \cos(k\Omega_0) \varphi_{ee}(k\Delta T).$$

In examples, the pulse radar device 1200 also has an analog/digital converter, for example the output circuit 595, which is configured to receive the intermediate frequency signal 1290 and to provide a digital signal which is configured to obtain an item of information relating to a period between the outputting of a pulse of the transmitter signal 1204 and the reception of an echo of the pulse as a receiver signal 1220.

On account of the use of the electrical circuit 100, 500, the SSPR concept mentioned at the outset can be used in a particularly advantageous manner. For example, the current consumption can be scaled with the duty factor of the pulses. Furthermore, a frequency of the intermediate frequency signal 1290 may be constant and its bandwidth may be particularly low, for example around 200 kHz. Furthermore, signal evaluation is possible without a fast Fourier transform. The concept may be particularly tolerant with respect to deviations of the RF frequency and with respect to phase noise of a VCO. In contrast to conventional implementations of the SSPR concept, the electrical circuits 100, 500, 600, 700 may be particularly insensitive to phase noise of a clock signal since the holding stage may be directly synchronized with the LO signal 1210.

Furthermore, the electrical circuit 100, 500 can be implemented in an integrated circuit, in particular using the proposed implementations of the mixer 130, 330, the short-time integrator 442 and the differential amplifier 550 with the circuits 852, 1052. An implementation of the SSPR concept using the electrical circuit 100, 500 also provides a high degree of tolerance with respect to RF VCO phase noise and a very low IF bandwidth, which may be advantageous, in particular, for CMOS radar systems. Furthermore, the electrical circuit 100, 500 may have a very low transmission power, which may be helpful in order to meet spectral requirements.

Signal profiles of specific implementations of the pulse radar device 1200 are explained below.

Figure 15:
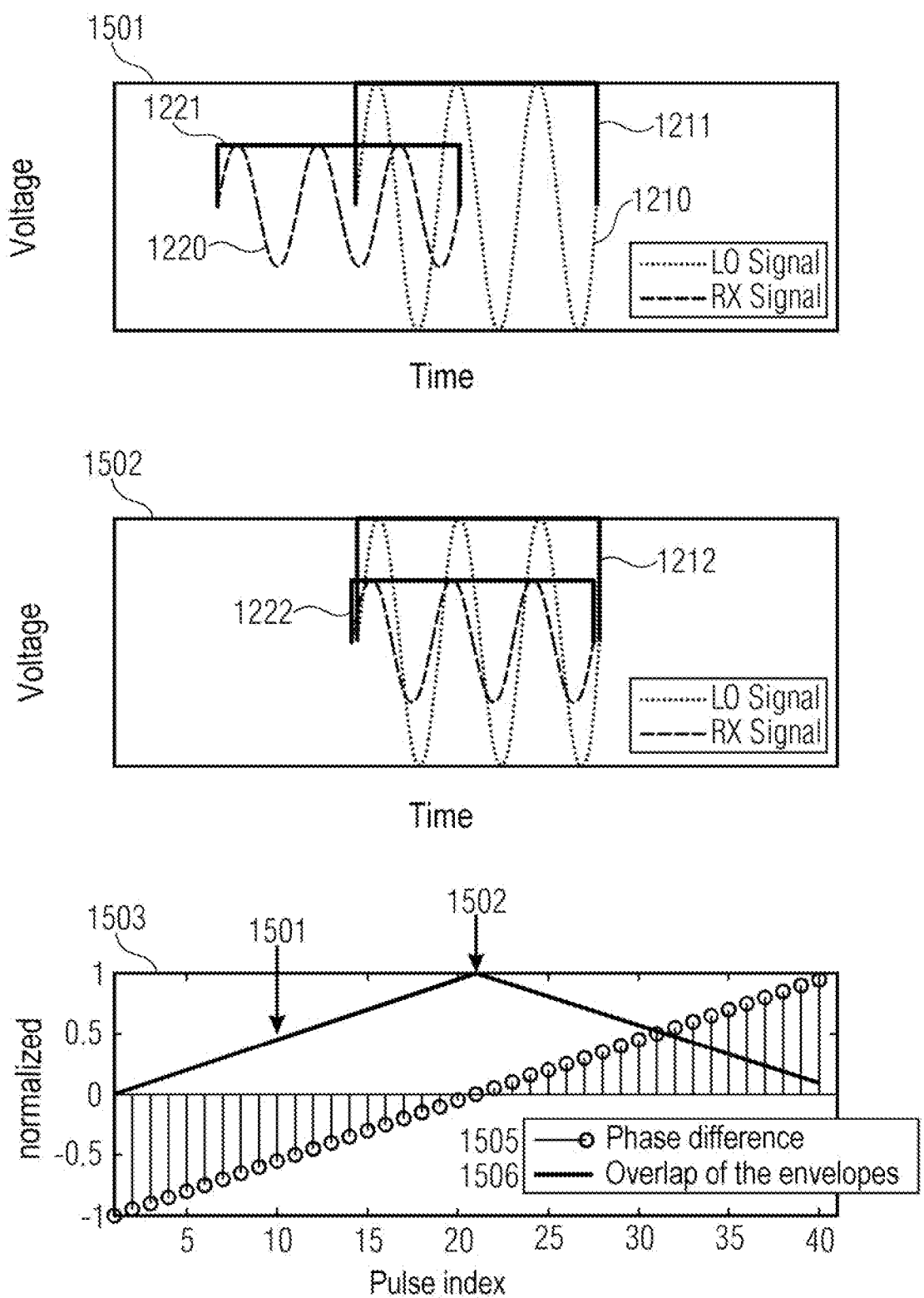
FIG. 15 shows an illustration of an example of a sliding overlap of a pulse of the LO signal with a pulse of the receiver signal.

FIG. 15 shows graphs with an example of a sliding overlap of pulses 1221 of the receiver signal 1220 and pulses 1211 of the LO signal 1210. The graph 1501 shows an overlap of the pulses 1221, 1211 at a first time. The graph 1502 shows an overlap of pulses 1212, 1222 at a second time. The graph 1503 illustrates a phase difference 1505 between the pulses 1211 and 1221 and 1212 and 1222 based on a pulse index of a sequence of pulses of the LO signal 1210 and of the receiver signal 1220. The curve 1506 represents an overlap of the envelope, for example of the intermediate frequency signal 1290.

Figure 16:
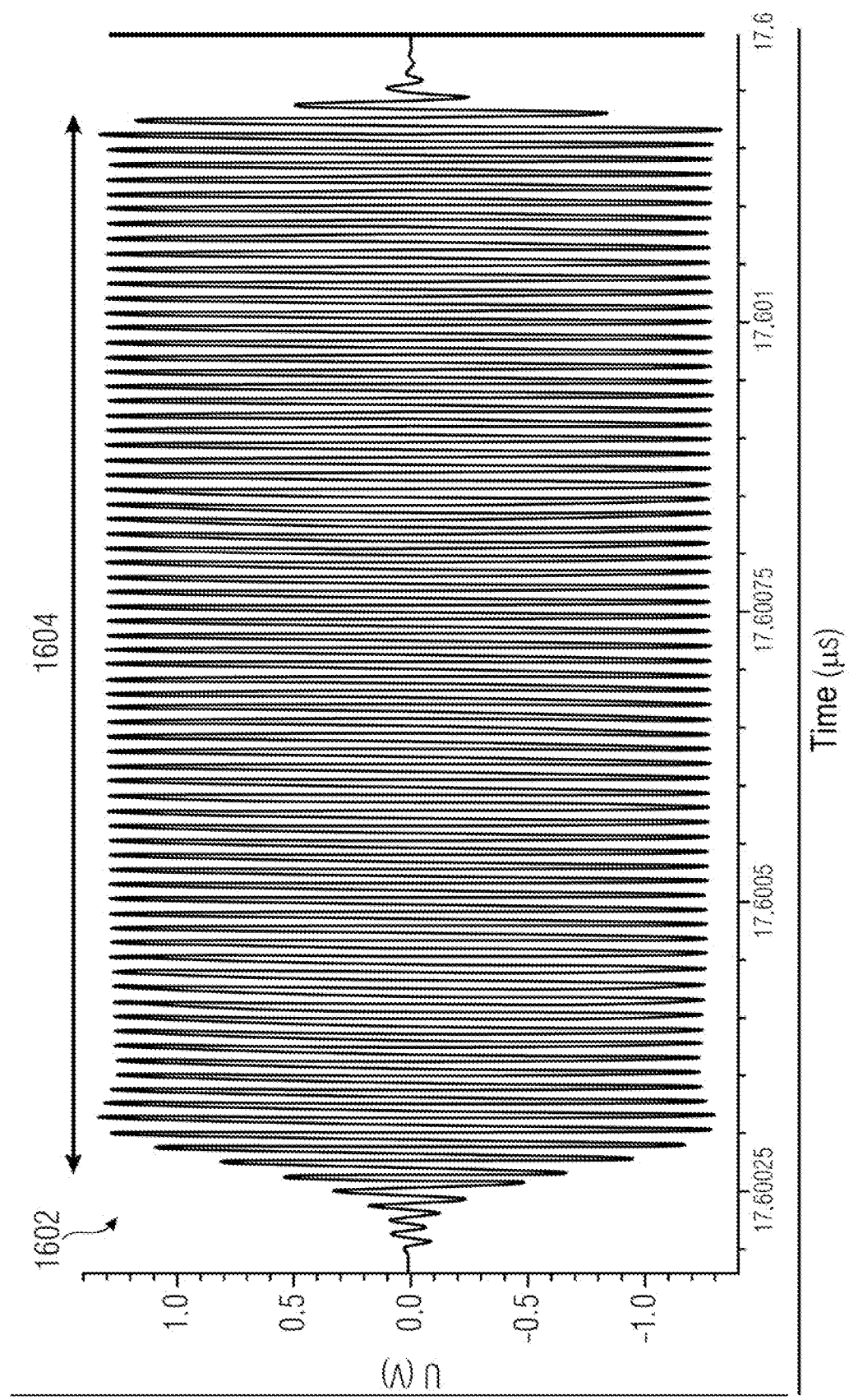
FIG. 16 shows a graph with an example of a pulse of a pulsed signal.

FIG. 16 shows a graph with an example of a pulse 1602 of the LO signal 1210 or of the transmitter signal 1204 and of the receiver signal 1220. The pulse 1602 has a pulse duration 1604 which is given by the inverse of a bandwidth of >1 GHz. The pulse 1602 has an internal frequency or a signal frequency of 79 GHz. An amplitude of the LO signal 1210 and an amplitude of the transmitter signal 1204 can be set independently of one another. A pulse rate of the LO signal and of the transmitter signal is in the region of 10 MHz, for example.

Figure 17:
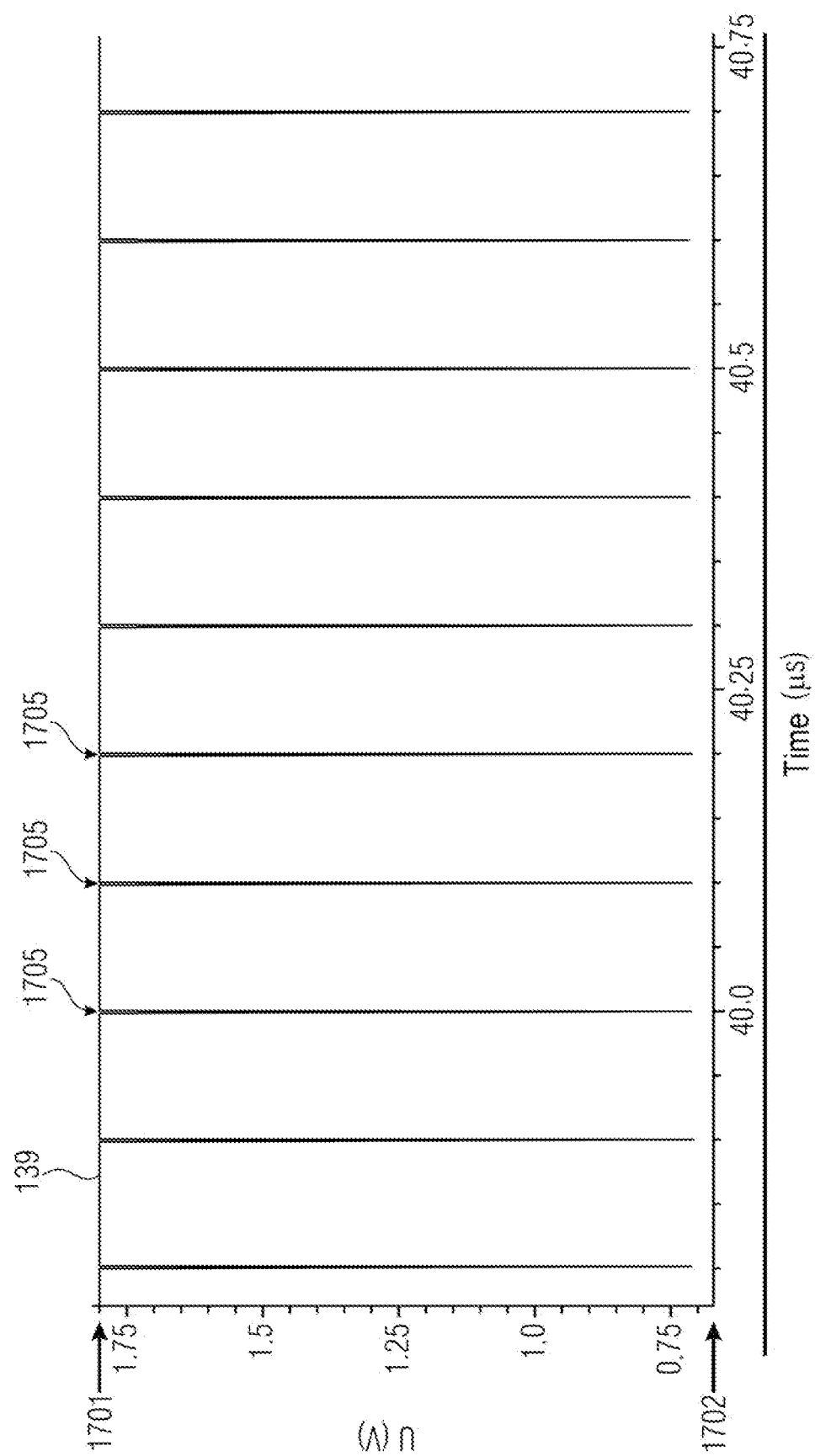
FIG. 17 shows a graph with an example of the mixer output signal in an asymmetrical signal representation.
Figure 18:
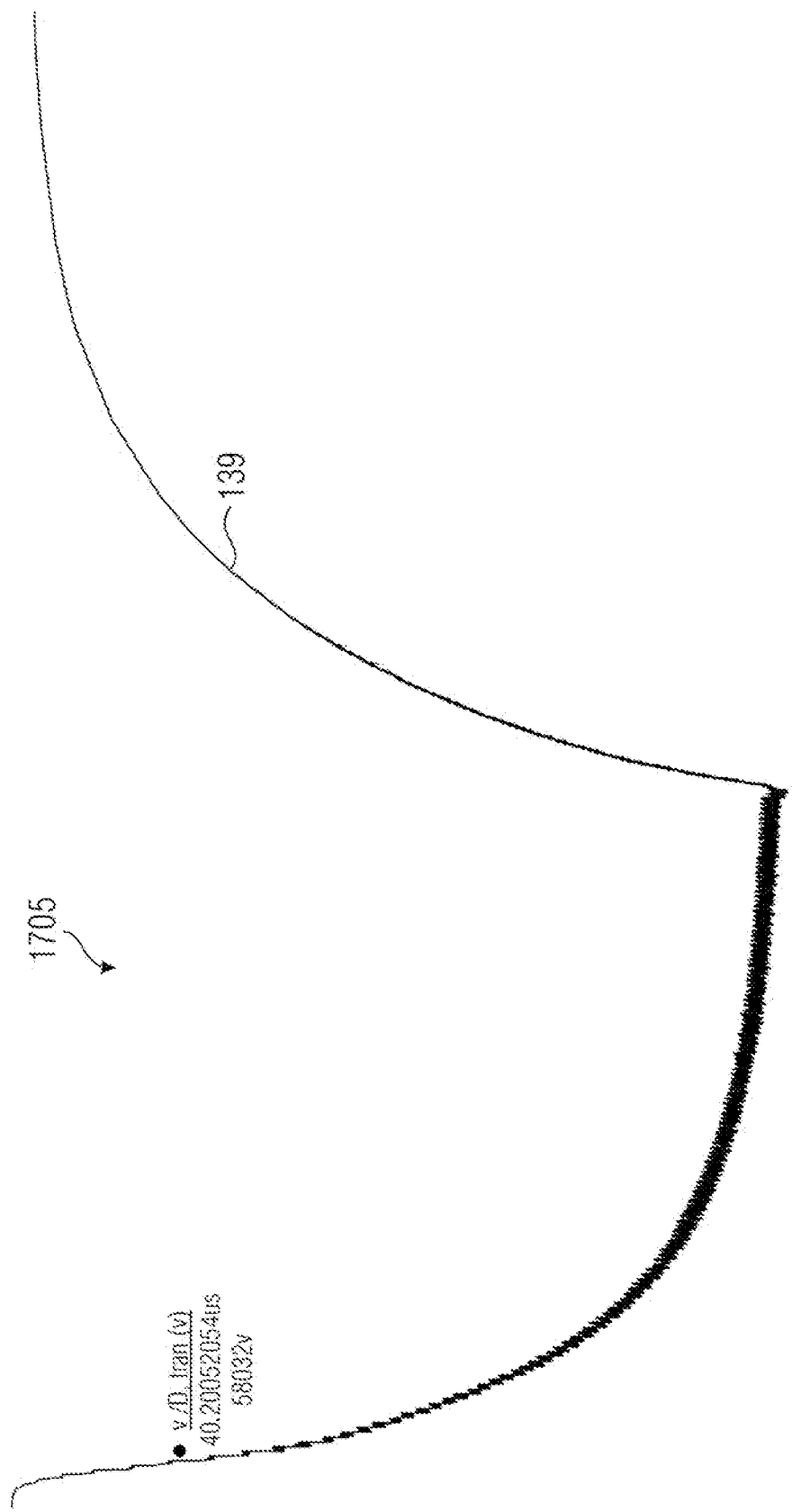
FIG. 18 shows a graph with an example of the mixer output signal in an asymmetrical signal representation.
Figure 19:
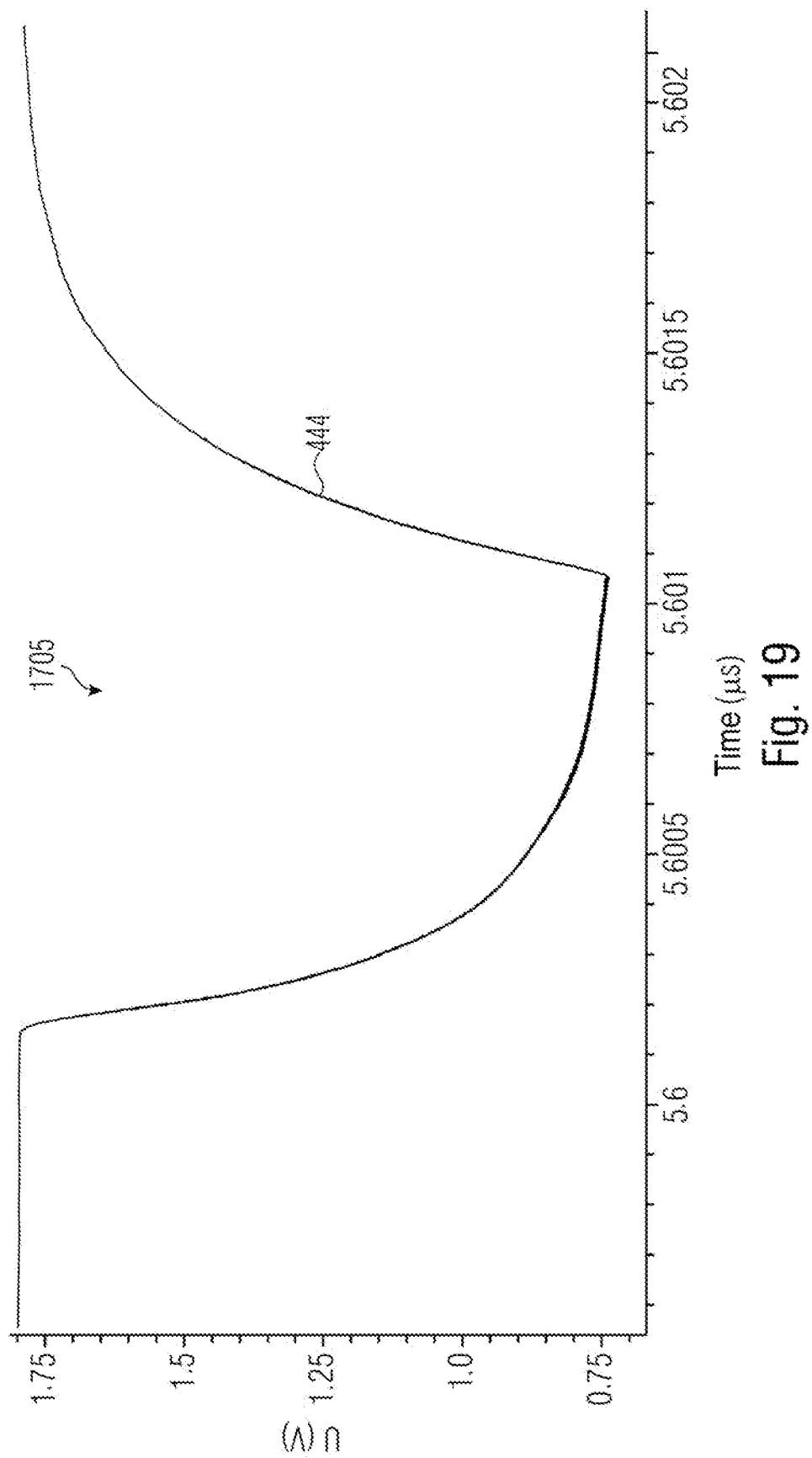
FIG. 19 shows a graph with an example of the integrator output signal in an asymmetrical signal representation.
Figure 20:
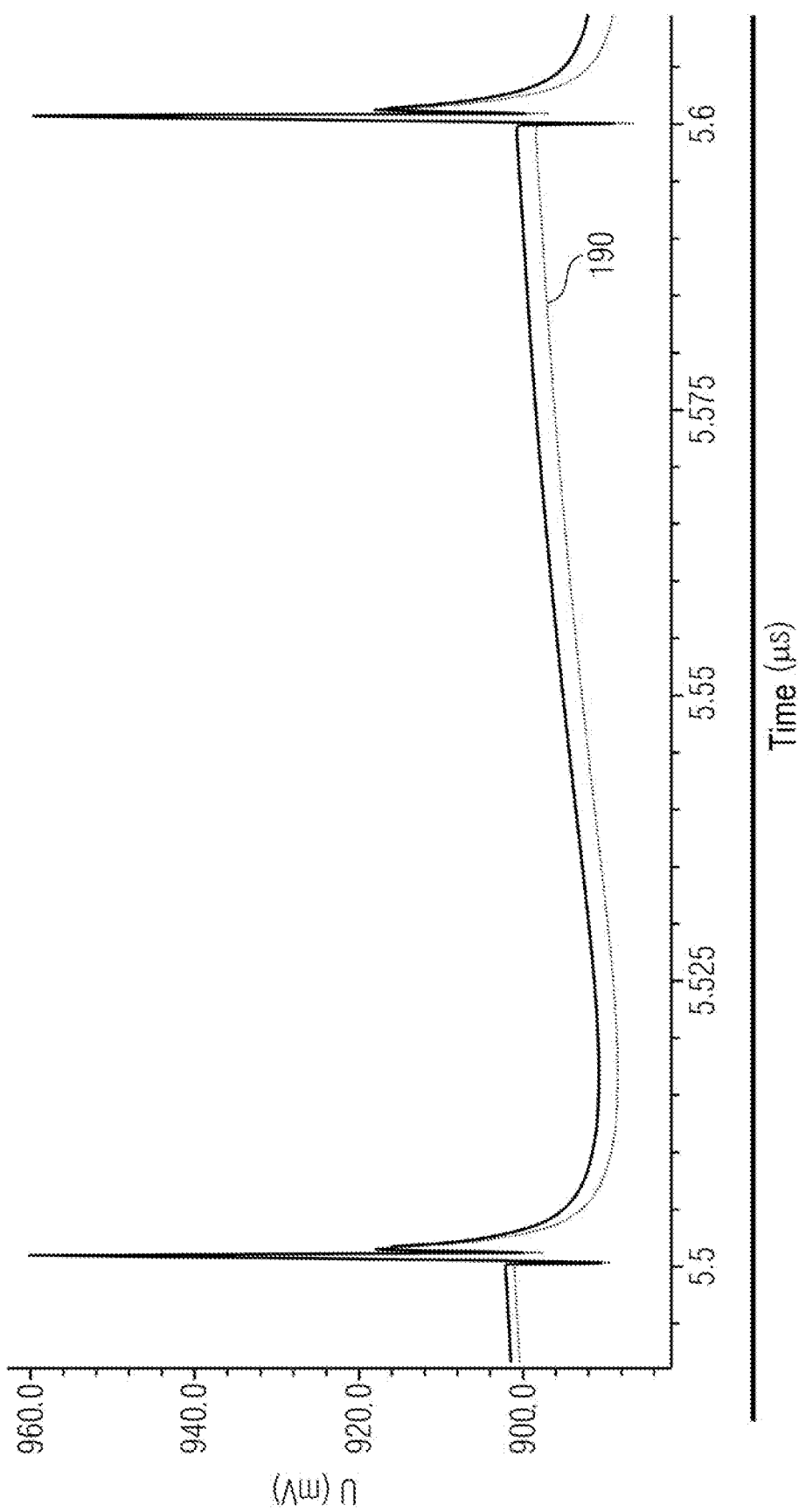
FIG. 20 shows a graph with an example of the output signal in an asymmetrical signal representation.

FIG. 17 shows a graph with an example of a signal profile of the mixer output signal 139. The mixer output signal 139 has a first level 1701 between two pulses 1705 and has a second level 1702 during a pulse 1705. A representation of a pulse 1705 of the mixer output signal 139 on a smaller timescale is shown in FIG. 18. FIG. 19 shows a graph with an example of the integrator output signal 444 based on the pulse 1705 of the mixer output signal 139, as shown in FIG. 18. As is clear from FIG. 19, the short-time integrator 442 may filter a radio-frequency component of the mixer output signal 139 and can allow a DC signal component to pass through in a substantially unfiltered form. A corresponding example of the output signal 190 is shown in a graph in FIG. 20.

Figure 21:
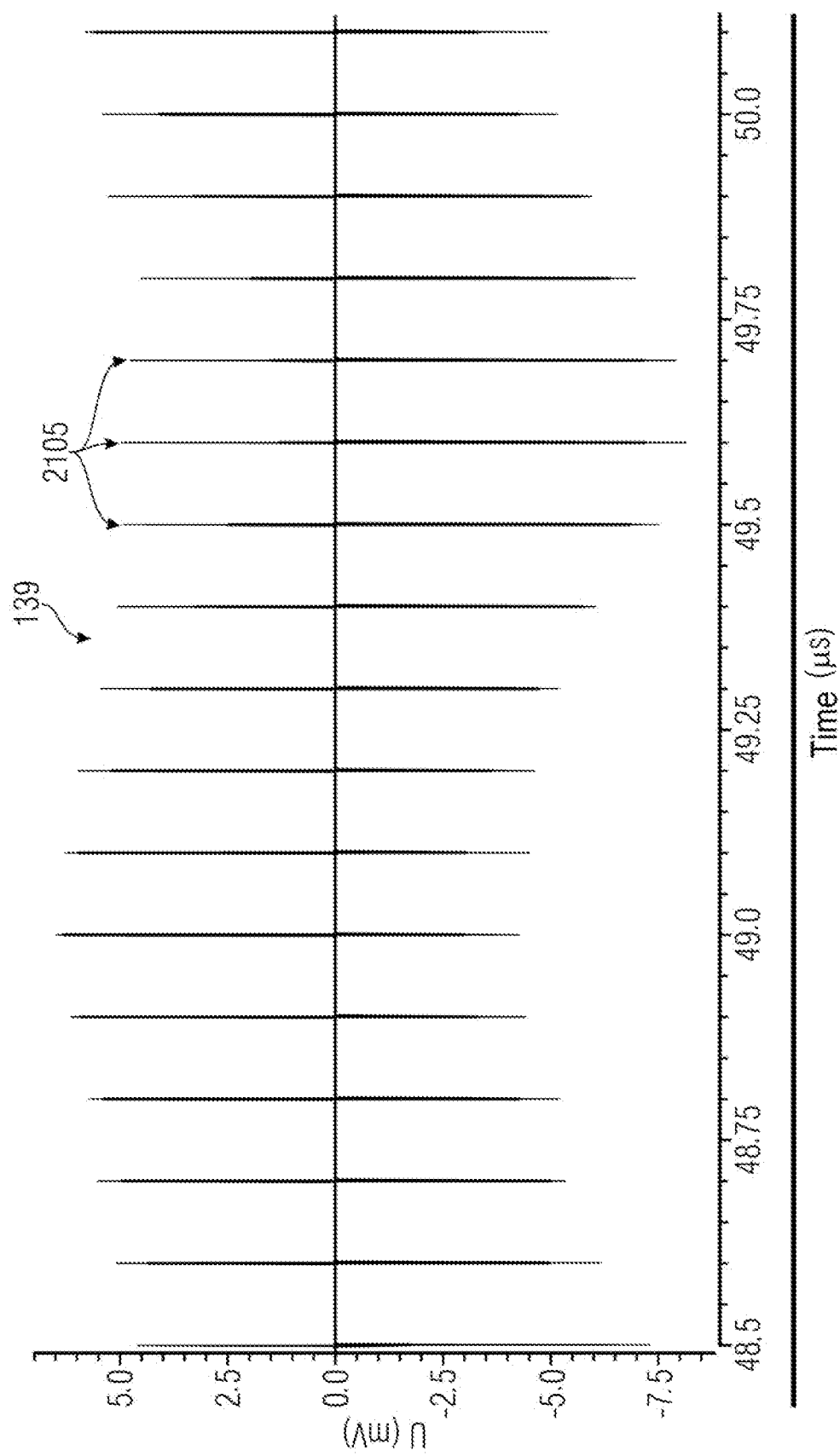
FIG. 21 shows a graph with an example of the mixer output signal in a symmetrical signal representation.
Figure 22:
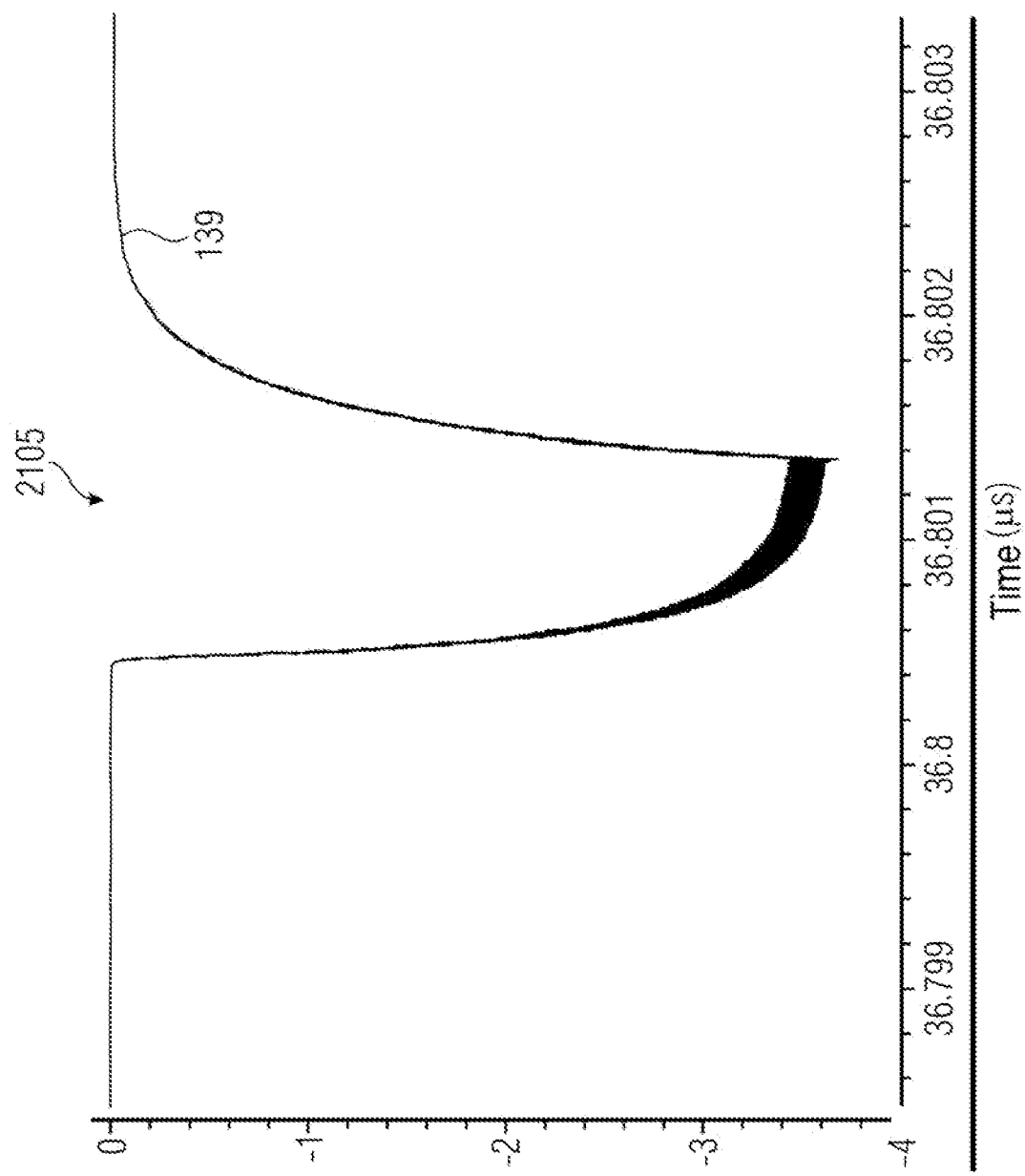
FIG. 22 shows a graph with a further example of the mixer output signal in a symmetrical signal representation.
Figure 23:
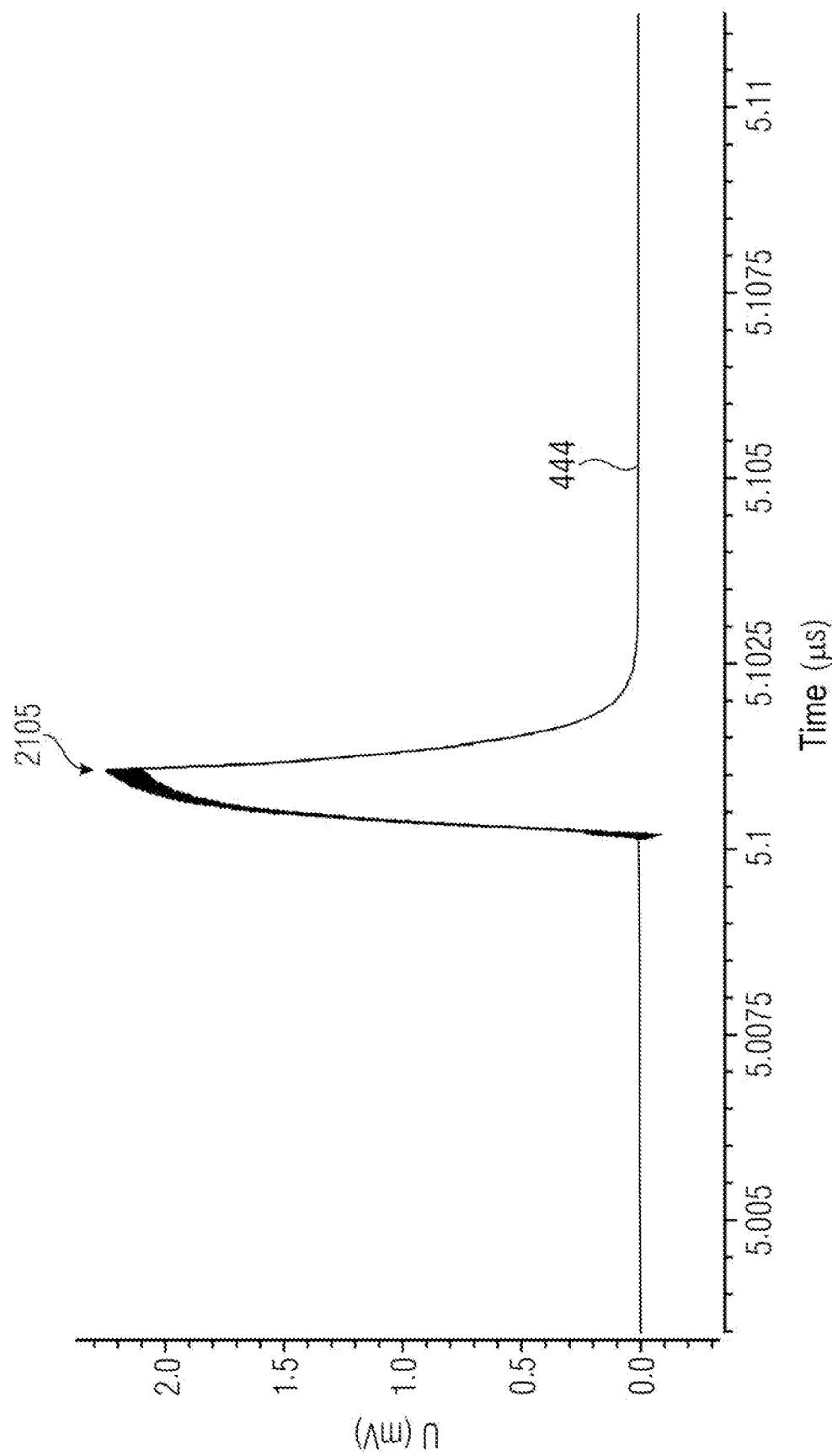
FIG. 23 shows a graph with an example of the integrator output signal in a symmetrical signal representation.
Figure 24:
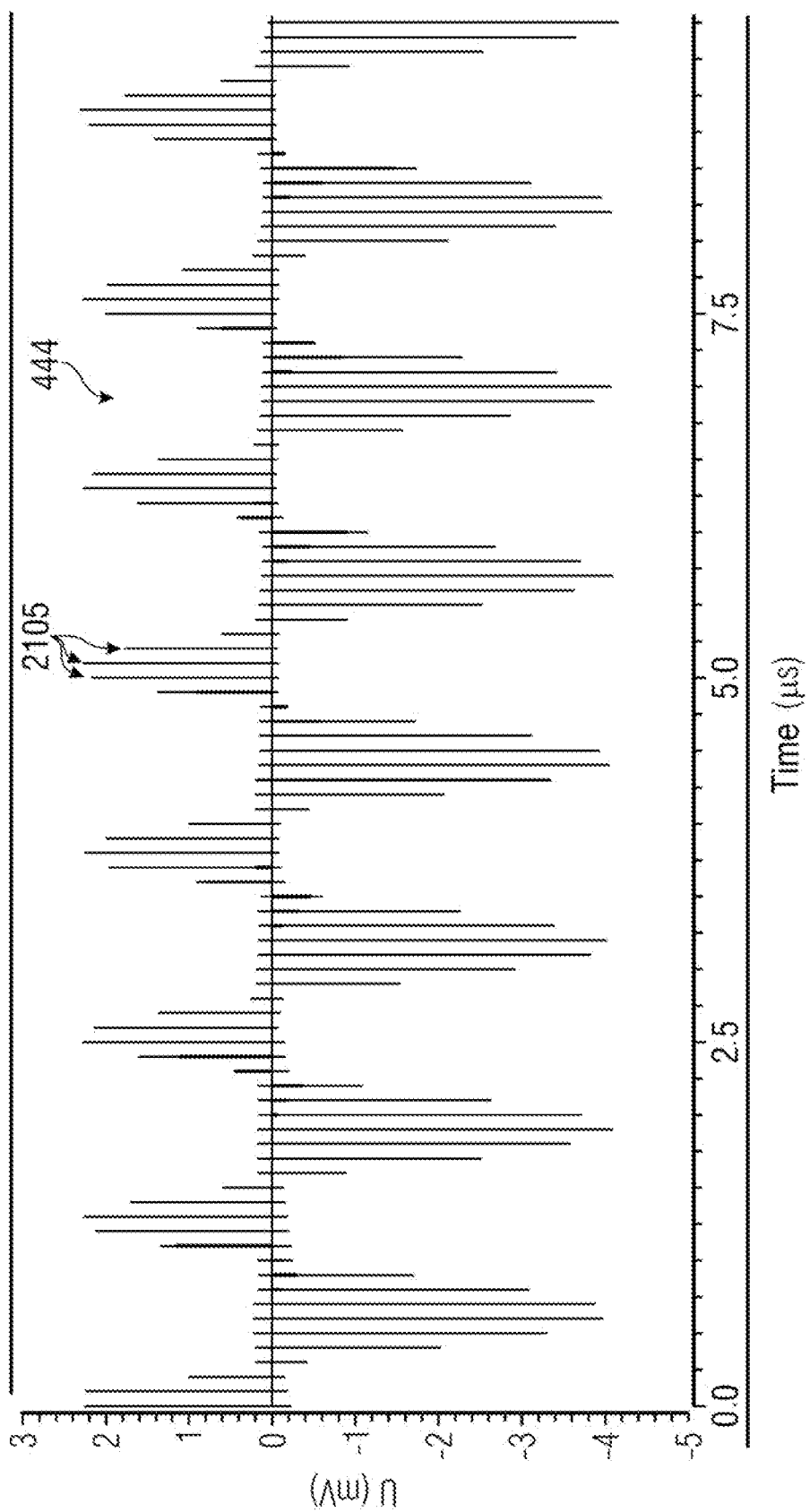
FIG. 24 shows a graph with a further example of the integrator output signal in a symmetrical signal representation.
Figure 25:
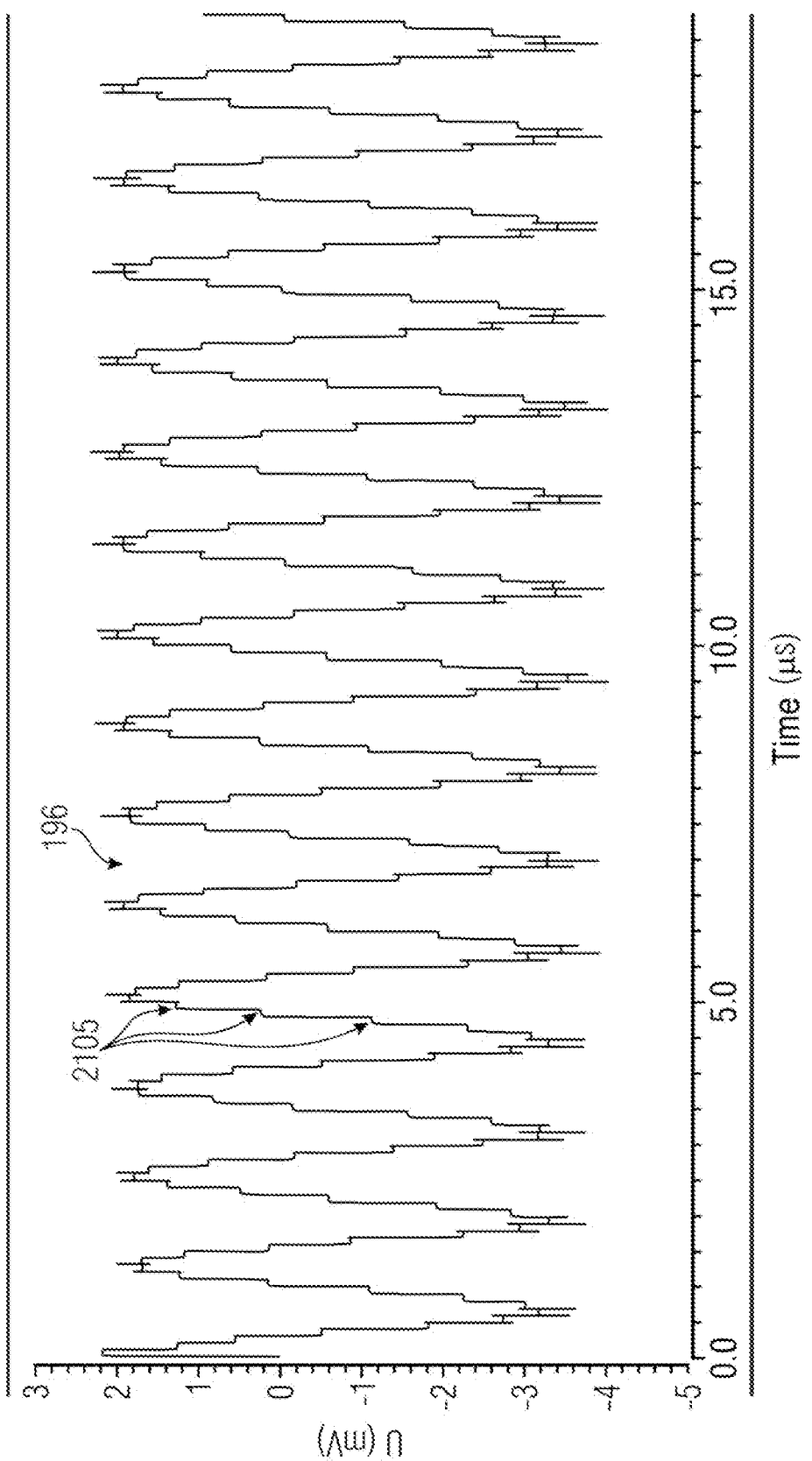
FIG. 25 shows a graph with an example of the output signal in a symmetrical signal representation.

FIG. 17 to FIG. 20 illustrate examples of signal profiles in an asymmetrical implementation. FIGS. 21 to 25 show corresponding signal profiles for an implementation with symmetrical signal transmission. FIG. 21 shows an example of the mixer output signal 139 for a plurality of pulses 2105. An illustration of an example of a pulse 2105 of the mixer output signal 139 on a smaller timescale is shown in FIG. 22. FIG. 23 shows an example of the integrator output signal 444 of the pulse 2105. An example of a signal profile of the integrator output signal 444 for a plurality of pulses 2105 is shown in FIG. 24. FIG. 25 shows an example of the output signal 190 for plurality of pulses 2105. FIG. 26 shows an example of a current consumption 2601 of a holding circuit, for example of the differential amplifier 550. The holding circuit may be in a switched-off state between two pulses 2605, with the result that the current consumption is zero or particularly low.

FIG. 27 shows a flowchart of an example of a method 2700 for providing an output signal 190 based on a first input signal 110 and a second input signal 120. The method 2700 comprises receiving 2701 the first input signal 110 and the second input signal 120. The method 2700 also comprises switching 2702 a mixer 130 on or off based on the first input signal 110 and mixing 2703 the first and second input signals 110, 120 in order to generate a mixer output signal 139, wherein a DC signal component of the mixer output signal 139 depends on whether the mixer 130 is switched on or off. The method 2700 also comprises switching 2704 a downstream circuit 140 on or off based on the DC signal component of the mixer output signal 139. The method 2700 also comprises providing the output signal 190 based on the mixer output signal 139. For example, the provision 2705 is effected using the downstream circuit 140.

Figure 28:
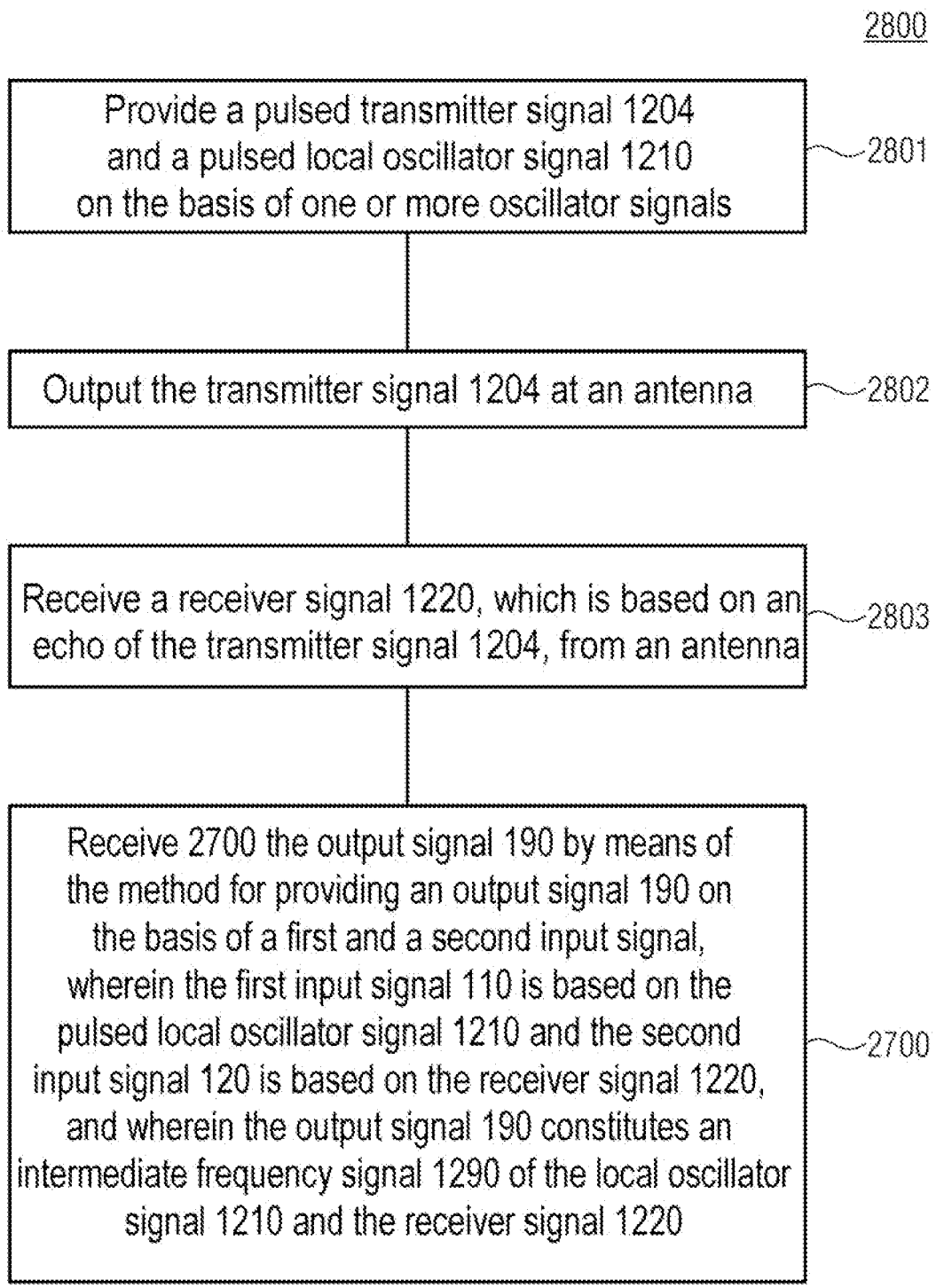
FIG. 28 shows a flowchart of an example of a radar method.

FIG. 28 shows a flowchart of an example of a radar method 2800. The radar method 2800 comprises providing 2801 a pulsed transmitter signal 1204 and a pulsed local oscillator signal 1210 based on one or more oscillator signals. The radar method 2800 also comprises outputting 2802 the transmitter signal 1204 at an antenna and receiving 2803 a receiver signal 1220, which is based on an echo of the transmitter signal 1204, from an antenna. Furthermore, the radar method 2800 comprises receiving 2700 the output signal 190 using the method 2700 for providing an output signal 190 based on a first and a second input signal 110, 120, wherein the first input signal 110 is based on the pulsed local oscillator signal 1210 and the second input signal 120 is based on the receiver signal 1220. In this case, the output signal 190 constitutes an intermediate frequency signal 1290 of the local oscillator signal 1210 and the receiver signal 1220.

Although some aspects of the present disclosure have been described as features in connection with an apparatus, it is clear that such a description can likewise be considered to be a description of corresponding method features. Although some aspects have been described as features in connection with a method, it is clear that such a description can also be considered to be a description of corresponding features of an apparatus or of the functionality of an apparatus.

In the detailed description above, different features were sometimes grouped together in examples in order to rationalize the disclosure. This type of disclosure is not intended to be interpreted as the intention that the claimed examples have more features than expressly stated in any claim. Rather, as reflected by the following claims, the subject matter may lie in fewer features than all of the features of an individual example disclosed. Consequently, the following claims are hereby included in the detailed description, in which case each claim can stand as its own separate example. Whereas each claim can stand as its own separate example, it should be noted that, although dependent claims in the claims refer back to a specific combination with one or more other claims, other examples also comprise a combination of dependent claims with the subject matter of any other dependent claim or of a combination of each feature with other dependent or independent claims. Such combinations are included, unless it is stated that a specific combination is not intended. Furthermore, it is intended that a combination of features of a claim with any other independent claim is also included even if this claim is not directly dependent on the independent claim.

The example implementations described above are merely an illustration of the principles of the present disclosure. It is to be noted that modifications and variations of the arrangements and details described herein will be obvious to other experts. It is therefore intended that the disclosure is restricted only by the scope of protection of the following patent claims and not by the specific details presented herein based on the description and explanation of the example implementations.

The invention claimed is:

1. An electrical circuit, comprising:
   a mixer configured to receive and mix a first input signal and a second input signal to generate a mixer output signal and to switch on or off based on the first input signal, wherein a DC signal component of the mixer output signal depends on whether the mixer is switched on or off; and
   a downstream circuit configured to switch on or off based on the DC signal component the mixer output signal and to provide an output signal based on the mixer output signal.

2. The electrical circuit as claimed in claim 1, wherein the DC signal component of the mixer output signal has a first level if the mixer is switched on and a second level if the mixer is switched off.

3. The electrical circuit as claimed in claim 1, wherein the mixer has at least one transistor, wherein the transistor is biased in such a manner that the transistor is switched off if a power of the first input signal is below an input threshold value and is switched on if the power of the first input signal is above the input threshold value, and wherein the mixer is configured to provide the DC signal component of the mixer output signal based on a DC component of a current through the transistor.

4. The electrical circuit as claimed in claim 3, wherein the mixer is configured to modulate the current through the transistor in a switched-on state based on at least the second input signal and to provide the mixer output signal based on the current through the transistor.

5. The electrical circuit as claimed in claim 1, wherein the downstream circuit has a short-time integrator which is configured to provide an integrator output signal based on the mixer output signal, wherein an amplitude of a useful signal component of the integrator output signal depends on a temporal overlap of a pulse of the first input signal and a pulse of the second input signal.

6. The electrical circuit as claimed in claim 5, wherein the short-time integrator has a low-pass filter, wherein the low-pass filter has a cut-off frequency which is higher than an inverse of a pulse duration of the first input signal and the second input signal and is lower than a signal frequency of the first input signal and the second input signal, with a result that the DC signal component of the mixer output signal remains substantially unfiltered.

7. The electrical circuit as claimed in claim 5, wherein the downstream circuit has a differential amplifier which is configured to provide the output signal based on the integrator output signal, wherein the differential amplifier is configured to switch on or off based on a DC signal component of the integrator output signal.

8. The electrical circuit as claimed in claim 5, wherein the downstream circuit has a differential amplifier which is configured to provide the output signal based on the integrator output signal, wherein the differential amplifier is configured to switch on or off based on the DC signal component of the mixer output signal.

9. The electrical circuit as claimed in claim 7, wherein the differential amplifier has at least one transistor, wherein the at least one transistor is either switched on or off depending on whether the DC signal component of the mixer output signal is below or above a mixed signal threshold value.

10. The electrical circuit as claimed in claim 7, wherein the differential amplifier is configured to hold a voltage applied to an output of the differential amplifier in a switched-off state.

11. The electrical circuit as claimed in claim 9, wherein the differential amplifier has a switching transistor arranged between a supply connection and the at least one transistor, wherein the switching transistor is configured to switch to an on or off state depending on whether the DC signal component of the mixer output signal or of the integrator output signal is below or above a mixed signal threshold value.

12. The electrical circuit as claimed in claim 5, wherein the downstream circuit has a holding capacitance which is coupled to an output of the downstream circuit for providing the output signal.

13. A pulse radar device, comprising:
at least one pulse generator configured to provide a pulsed transmitter signal and a pulsed local oscillator signal based on one or more oscillator signals, wherein the pulse radar device is configured to output the pulsed transmitter signal and to receive a receiver signal which is based on an echo of the pulsed transmitter signal; and
an electrical circuit as claimed in claim 1, wherein the first input signal is based on the pulsed local oscillator signal and the second input signal is based on the receiver signal, and wherein the output signal constitutes an intermediate frequency signal of the pulsed local oscillator signal and the receiver signal.

14. The pulse radar device as claimed in claim 13, wherein the first input signal has a sequence of pulses, wherein a power of the first input signal is above an input threshold value during a pulse and is below the input threshold value between two pulses.

15. The pulse radar device as claimed in claim 13, wherein a pulse rate of the pulsed local oscillator signal is $10^{-6}\%$ to $10^{-3}\%$ greater or less than a pulse rate of the pulsed transmitter signal.

16. The pulse radar device as claimed in claim 15, wherein a frequency of the intermediate frequency signal is based on a difference between pulse rates of the pulsed local oscillator signal and the pulsed transmitter signal.

17. The pulse radar device as claimed in claim 13, wherein a duty factor of the first input signal is less than 5%.

18. The pulse radar device as claimed in claim 13, wherein the pulse radar device is configured to obtain, based on the intermediate frequency signal, an item of information relating to a period between an outputting of a pulse of the pulsed transmitter signal and a reception of an echo of the pulse as a receiver signal.

19. The pulse radar device as claimed in claim 13, also having an analog/digital converter which is configured to receive the intermediate frequency signal and to provide a digital signal which is configured to obtain an item of information relating to a period between an outputting of a pulse of the transmitter signal and a reception of an echo of the pulse as a receiver signal.

20. A method, comprising:
receiving a first input signal and a second input signal,
switching a mixer on or off based on the first input signal,
mixing the first input signal and the second input signal in order to generate a mixer output signal, wherein a DC signal component of the mixer output signal depends on whether the mixer is switched on or off,
switching a downstream circuit on or off based on the DC signal component of the mixer output signal, and
providing an output signal based on the mixer output signal.

21. A radar method comprising:
providing a pulsed transmitter signal and a pulsed local oscillator signal based on one or more oscillator signals,
outputting the pulsed transmitter signal at an antenna,
receiving a receiver signal, which is based on an echo of the pulsed transmitter signal, from an antenna, and
receiving the output signal using the method as claimed in claim 20, wherein the first input signal is based on the pulsed local oscillator signal and the second input signal is based on the receiver signal, and wherein the output signal constitutes an intermediate frequency signal of the pulsed local oscillator signal and the receiver signal.

\* \* \* \* \*